United States Patent
Ono et al.

(10) Patent No.: US 6,724,466 B2
(45) Date of Patent: Apr. 20, 2004

(54) STAGE ASSEMBLY INCLUDING A DAMPING ASSEMBLY

(75) Inventors: Kazuya Ono, Saitama (JP); Andrew J. Hazelton, San Carlos, CA (US)

(73) Assignee: Nikon Corporation (JP)

( * ) Notice: Subject to any disclaimer, the term of this patent is extended or adjusted under 35 U.S.C. 154(b) by 11 days.

(21) Appl. No.: 10/107,663

(22) Filed: Mar. 26, 2002

(65) Prior Publication Data

US 2003/0184724 A1 Oct. 2, 2003

(51) Int. Cl.⁷ .......................... G03B 27/58; G03B 27/62
(52) U.S. Cl. ............................................. 355/72; 355/75
(58) Field of Search ............................. 355/53, 72, 75, 355/77

(56) References Cited

U.S. PATENT DOCUMENTS

| | | | |
|---|---|---|---|
| 4,444,492 A | 4/1984 | Lee | |
| 4,821,205 A | 4/1989 | Schutten et al. | |
| 5,208,497 A | 5/1993 | Ishii et al. | |
| 5,227,839 A | 7/1993 | Allen | |
| 5,255,051 A | 10/1993 | Allen | |
| 5,280,677 A * | 1/1994 | Kubo et al. .................. | 33/1 M |
| 5,815,246 A | 9/1998 | Sperling et al. | |
| 5,864,389 A | 1/1999 | Osanai et al. | |
| 5,969,441 A | 10/1999 | Loopstra et al. | |
| 5,991,005 A * | 11/1999 | Horikawa et al. ............ | 355/53 |
| 6,028,376 A | 2/2000 | Osanai et al. | |
| 6,252,370 B1 | 6/2001 | Ebihara et al. | |
| 6,262,794 B1 | 7/2001 | Miyajima | |
| 6,271,606 B1 | 8/2001 | Hazelton | |
| 6,281,654 B1 | 8/2001 | Lee | |
| 6,322,060 B1 | 11/2001 | Mayama et al. | |
| 6,323,483 B1 | 11/2001 | Cleveland et al. | |
| 6,323,935 B1 | 11/2001 | Ebihara et al. | |
| 6,337,484 B1 * | 1/2002 | Loopstra et al. ........ | 250/442.11 |
| 6,355,994 B1 | 3/2002 | Andeen et al. | |
| 6,359,679 B1 | 3/2002 | Ito et al. | |
| 6,408,045 B1 | 6/2002 | Matsui et al. | |
| 6,449,030 B1 * | 9/2002 | Kwan .......................... | 355/53 |
| 6,493,062 B2 | 12/2002 | Tokuda et al. | |
| 2001/0006762 A1 | 7/2001 | Kwan et al. | |

FOREIGN PATENT DOCUMENTS

| | | |
|---|---|---|
| JP | 7-142331 | 6/1995 |
| WO | WO 98/28665 | 7/1998 |
| WO | WO 98/40791 | 9/1998 |
| WO | WO 01/47001 A1 | 6/2001 |

OTHER PUBLICATIONS

U.S. patent application Ser. No. 09/721,733, Nishi, filed Nov. 27, 2000.

* cited by examiner

Primary Examiner—Russell Adams
Assistant Examiner—D. Ben Esplin
(74) Attorney, Agent, or Firm—Steven G. Roeder; Jim Rose

(57) ABSTRACT

A stage assembly (10) for moving and positioning a device (30) includes a stage (14), a stage mover assembly (16), a device table (18), a table mover assembly (20) and a damping assembly (22). The table mover assembly (20) moves the device table (18) along a Z axis, about an X axis and about a Y axis relative to the stage (14) and generates reaction forces. The damping assembly (22) is coupled to the table mover assembly (20). Uniquely, the damping assembly (22) reduces the reaction forces created by the table mover assembly (20) that are transferred to the stage (14).

201 Claims, 10 Drawing Sheets

FIG. 1
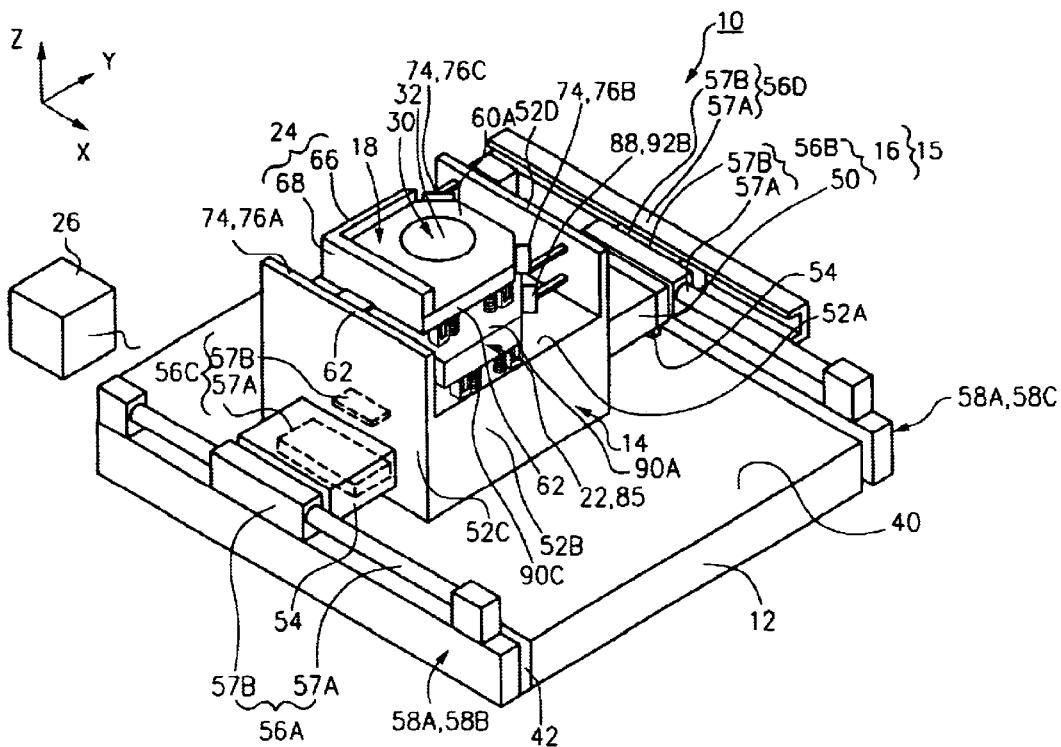
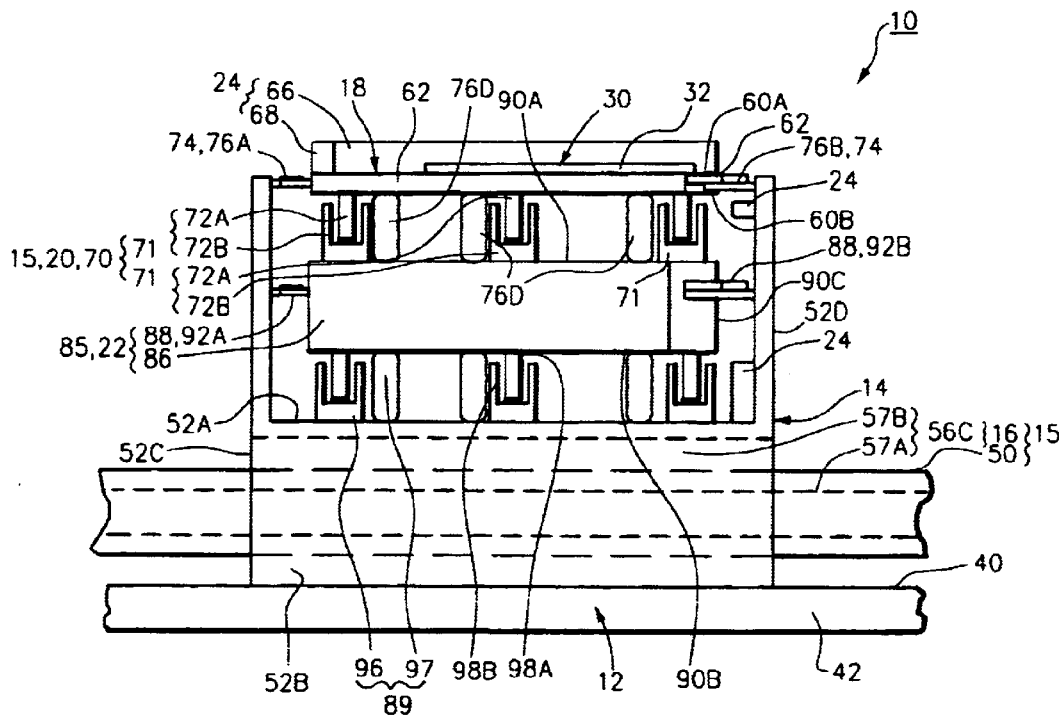
FIG. 2A

STAGE ASSEMBLY INCLUDING A DAMPING ASSEMBLY

FIELD OF THE INVENTION

The present invention is directed to a stage assembly for moving a device. More specifically, the present invention is directed to a stage assembly including a damping assembly for an exposure apparatus.

BACKGROUND

Exposure apparatuses are commonly used to transfer images from a reticle onto a semiconductor wafer during semiconductor processing. A typical exposure apparatus includes an illumination source, a reticle stage assembly that retains a reticle, a lens assembly and a wafer stage assembly that retains a semiconductor wafer. The reticle stage assembly and the wafer stage assembly are supported above a ground with an apparatus frame.

Typically, the wafer stage assembly includes a wafer stage base, a wafer stage, a wafer table that retains the wafer, and a wafer stage mover assembly that precisely positions the wafer stage, the wafer table and the wafer. Additionally, the wafer stage assembly can include a table mover assembly that moves the wafer table relative to the wafer stage. Somewhat similarly, the reticle stage assembly includes a reticle stage base, a reticle stage that retains the reticle, and a reticle stage mover assembly that precisely positions the reticle stage and the reticle. The size of the images transferred onto the wafer from the reticle is extremely small. Accordingly, the precise relative positioning of the wafer and the reticle is critical to the manufacturing of high density, semiconductor wafers.

Unfortunately, the wafer stage mover assembly and the table mover assembly generate reaction forces and disturbances that can vibrate the wafer stage base and the apparatus frame. The vibration influences the position of the wafer stage base, the wafer stage, the wafer table, and the wafer. As a result thereof, the vibration can cause an alignment error between the reticle and the wafer. This reduces the accuracy of positioning of the wafer relative to the reticle and degrades the accuracy of the exposure apparatus.

In light of the above, there is a need for a stage assembly that precisely positions a device. Additionally, there is a need for a stage assembly that reduces the influence of reaction forces from the table mover assembly upon the position of the wafer table, the wafer stage, the wafer stage base, and the apparatus frame. Moreover, there is a need for an exposure apparatus capable of manufacturing precision devices such as high density, semiconductor wafers.

SUMMARY

The present invention is directed to a stage assembly for moving a device relative to a stage base. The stage assembly includes a stage, a mover assembly, a device table, and a damping assembly. The mover assembly includes a stage mover assembly and a table mover assembly. The stage mover assembly is connected to the stage and moves the stage relative to the stage base. The device table retains the device. The table mover assembly is connected to the device table and moves the device table relative to the stage. The damping assembly is coupled to the mover assembly.

A number of embodiments of the stage assembly are provided herein. In one or more of these embodiments, the damping assembly reduces the reaction forces and disturbances created by the mover assembly that are transferred to the stage and the stage base. As a result thereof, the stage assembly can more accurately position the device. Further, the stage assembly can be used in an exposure apparatus to manufacture high density, high quality semiconductor wafers.

As provided herein, the table mover assembly moves the device table with at least one degree of freedom and more preferably at least three degree of freedom relative to the stage. For example, the table mover assembly can include a vertical mover assembly that moves the device table relative to the stage along a Z axis, about an X axis and about a Y axis relative to the stage. In this embodiment, the vertical mover assembly is coupled to the damping assembly so that the damping assembly reduces the reaction forces that are transferred to the stage and the stage base along the Z axis, about the X axis and about the Y axis.

Further, the table mover assembly can move the device table with six degrees of freedom relative to the stage. In this embodiment, the table mover assembly includes a horizontal mover assembly that moves the device table relative to the stage and the stage base along the X axis, along the Y axis and about the Z axis.

In the embodiments provided herein, the damping assembly includes a Z reaction mass and a mass guide. The table mover assembly is coupled to the Z reaction mass and the mass guide connects the Z reaction mass to the stage. With this design, the Z reaction mass moves relative to the stage and the stage base with at least one degree of freedom and more preferably three degrees of freedom. In one embodiment, the mass guide is a flexible connector that allows for motion of the Z reaction mass along the Z axis, about the X axis and about the Y axis and inhibits motion of the Z reaction mass along the X axis, along the Y axis and about the Z axis relative to the stage and the stage base.

In yet another embodiment of the present invention, the mover assembly moves the device table relative to the stage base with at least four degrees of freedom and more preferably at least six degrees of freedom. In this embodiment, the damping assembly is coupled to the mover assembly and reduces the reaction forces that are transferred to the stage base with at least four degrees of freedom and more preferably at least six degrees of freedom.

The present invention is also directed to an exposure apparatus, a device made with the exposure apparatus, a wafer made with the exposure apparatus, a method for making a stage assembly, a method for making an exposure apparatus, a method for making a device and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 1 is a perspective view of a first embodiment of a stage assembly having features of the present invention;

FIG. 2A is a side view of a portion of the stage assembly of FIG. 1;

DESCRIPTION

Figure 2B:
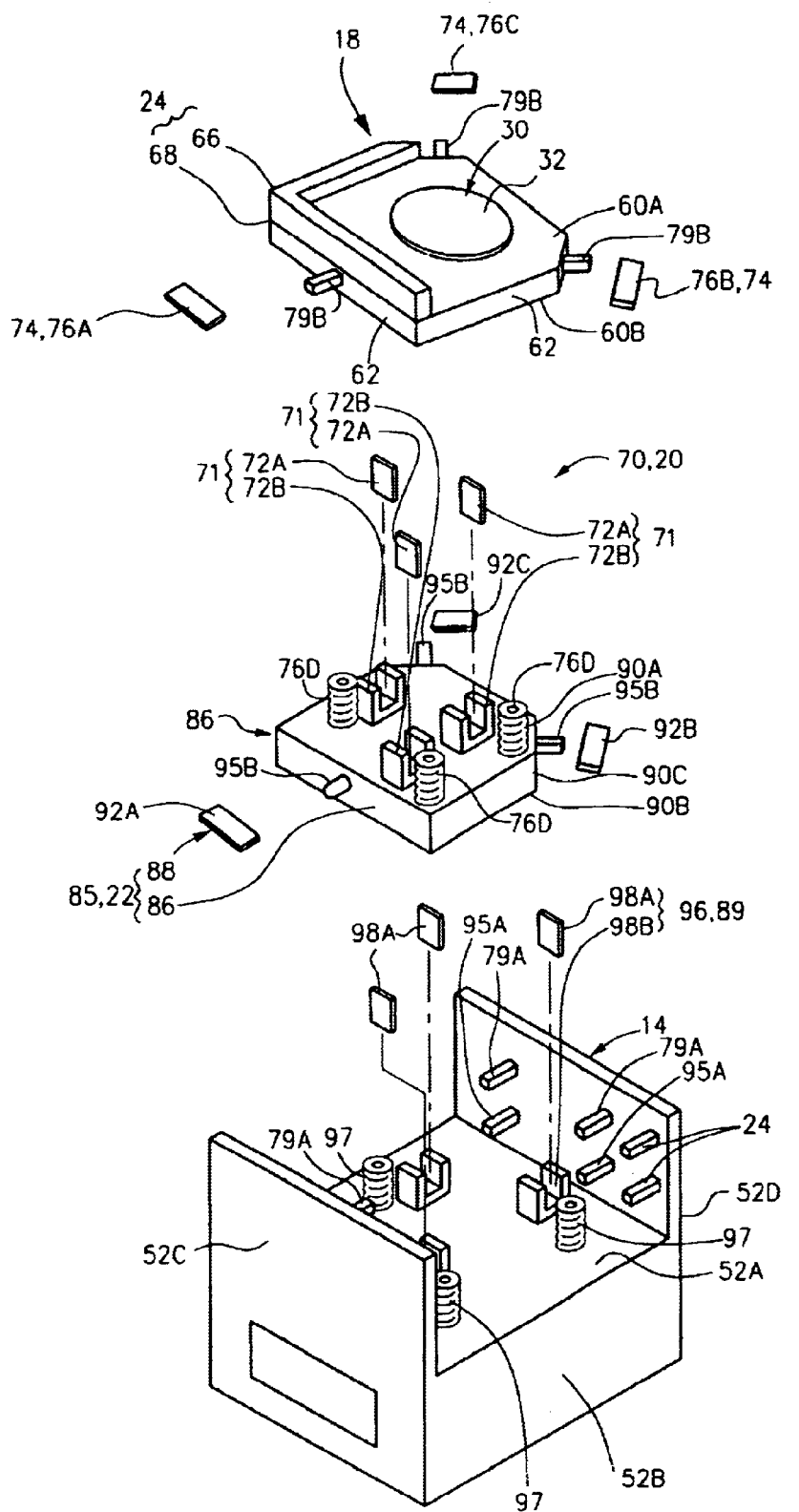
FIG. 2B is an exploded perspective view of a portion of the stage assembly of FIG. 1.

Referring initially to FIGS. 1–2B, a stage assembly 10, having features of the present invention, includes (i) a stage base 12, (ii) a stage 14, (iii) a mover assembly 15 including a stage mover assembly 16 and a table mover assembly 20, (iv) a device table 18, (v) a damping assembly 22, (vi) a measurement system 24 (only a portion is illustrated in FIG. 1), and (vii) a control system 26. The stage assembly 10 is positioned above a mounting base 28 (illustrated in FIG. 7). As an overview, the stage mover assembly 16 precisely moves the stage 14 and the device table 18 relative to the stage base 12 and the table mover assembly 20 precisely moves the device table 18 relative to the stage 14 and the stage base 12. Further, in some embodiments, the damping assembly 22 reduces and minimizes the magnitude of reaction forces and disturbances from the table mover assembly 20 that are transferred to the stage 14, the stage base 12 and the mounting base 28. This improves the positioning performance of the stage assembly 10.

The stage assembly 10 is particularly useful for precisely positioning a device 30 during a manufacturing and/or an inspection process. The type of device 30 positioned and moved by the stage assembly 10 can be varied. For example, the device (substrate) 30 can be a semiconductor wafer 32, and the stage assembly 10 can be used as part of an exposure apparatus 34 (illustrated in FIG. 7) for precisely positioning the semiconductor wafer 32 during manufacturing of the semiconductor wafer 32 relative to a reticle 36 (illustrated in FIG. 7). Alternately, for example, the stage assembly 10 can be used to move other types of devices during manufacturing and/or inspection, to move a device under an electron microscope (not shown), or to move a device during a precision measurement operation (not shown).

Some of the Figures provided herein include a coordinate system that designates an X axis, a Y axis that is orthogonal to the X axis, and a Z axis that is orthogonal to the X axis and the Y axis. It should be understood that the coordinate system is merely for reference and can be varied. For example, the Z axis can be switched with the Y axis or the X axis and/or the stage assembly 10 can be rotated. As used herein, the term "six degrees of freedom" shall include movement along the X axis, along the Y axis, along the Z axis, about the X axis, about the Y axis and about the Z axis.

Figure 3:
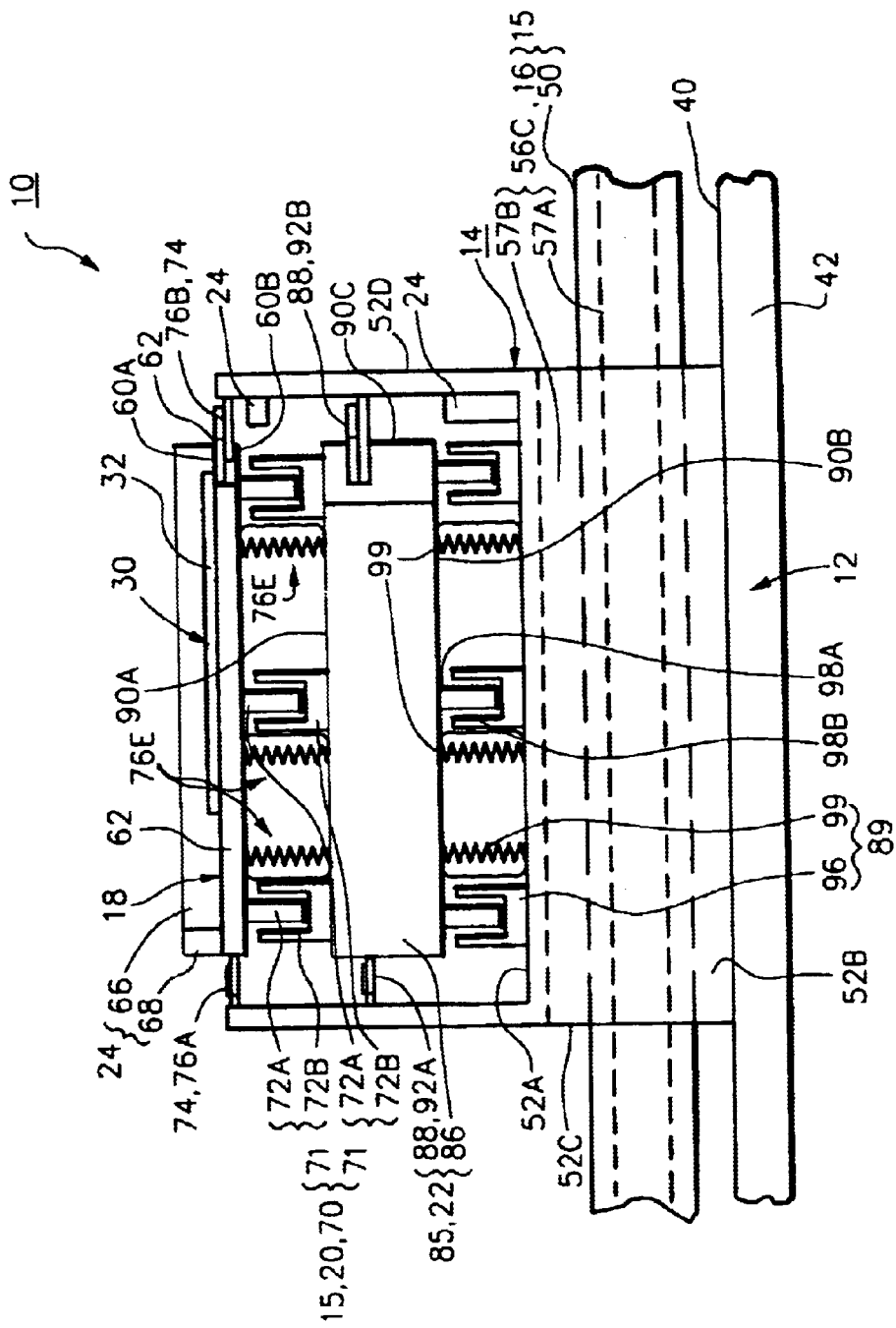
FIG. 3 is a side view of a portion of another embodiment of the stage assembly.
Figure 4:
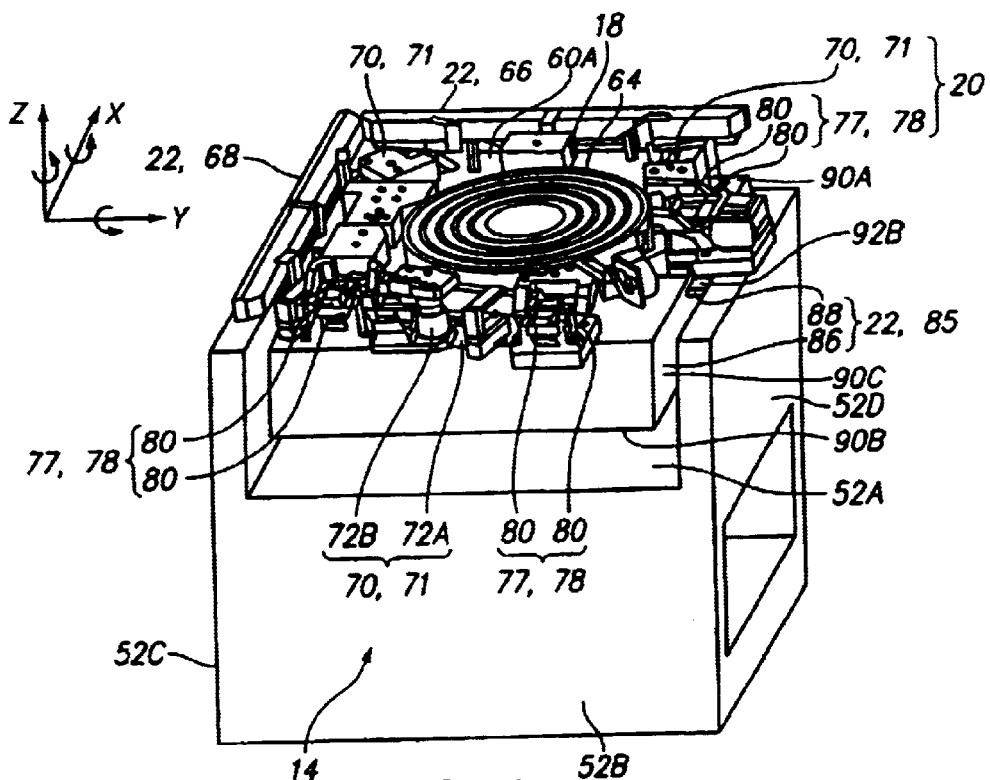
FIG. 4 is a perspective view of a portion of another embodiment of the stage assembly.
Figure 5:
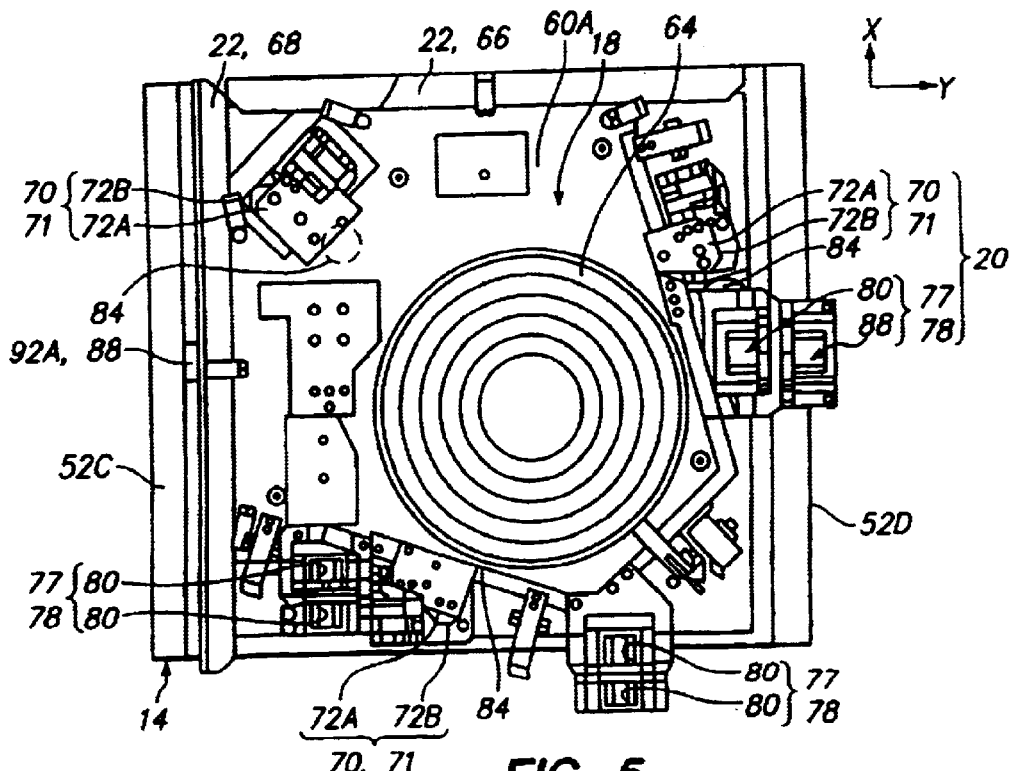
FIG. 5 is a top plan view of the portion of the stage assembly of FIG. 4.
Figure 8A:
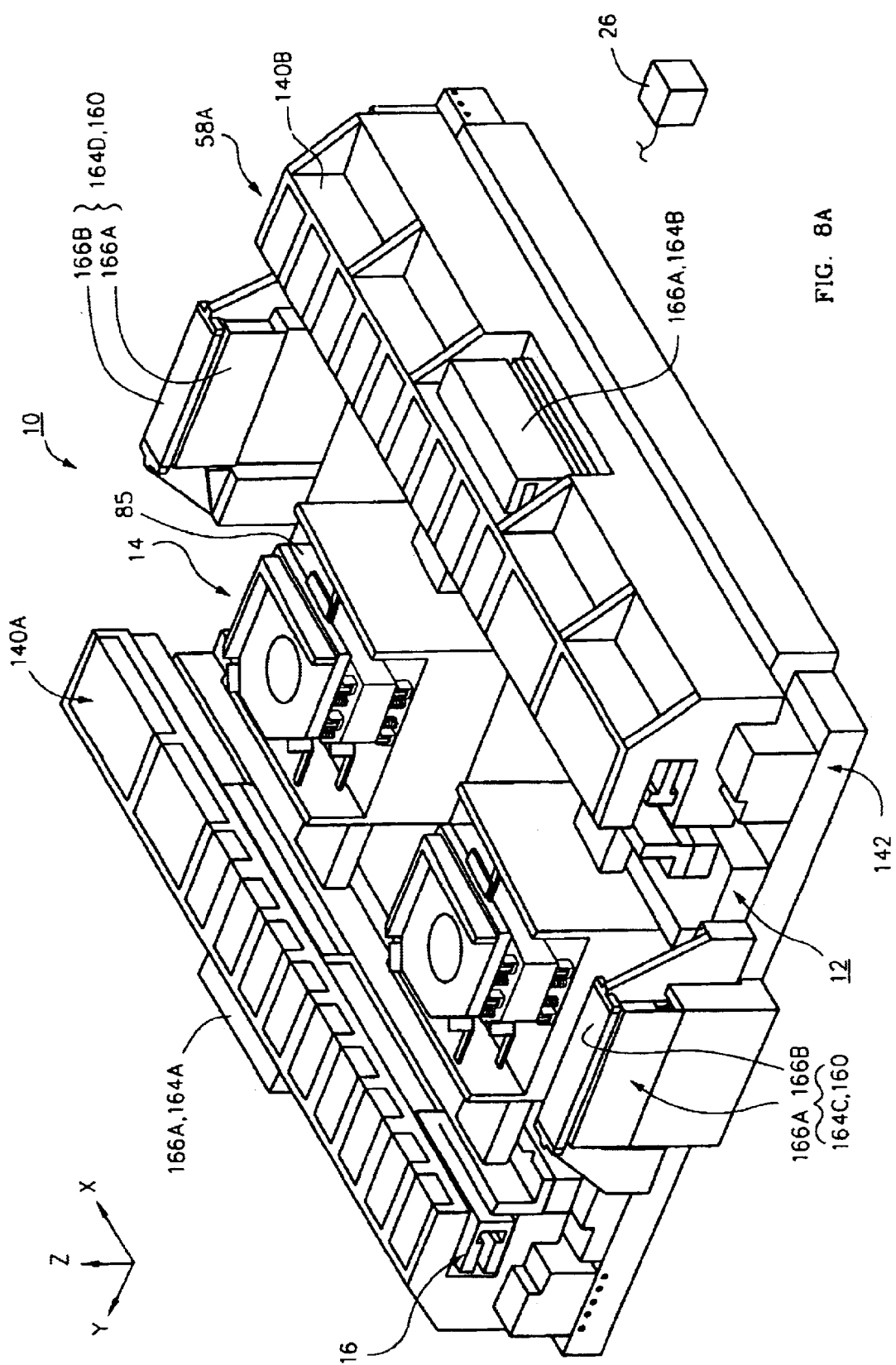
FIG. 8A is a perspective view of another embodiment of a stage assembly having features of the present invention.
Figure 8B:
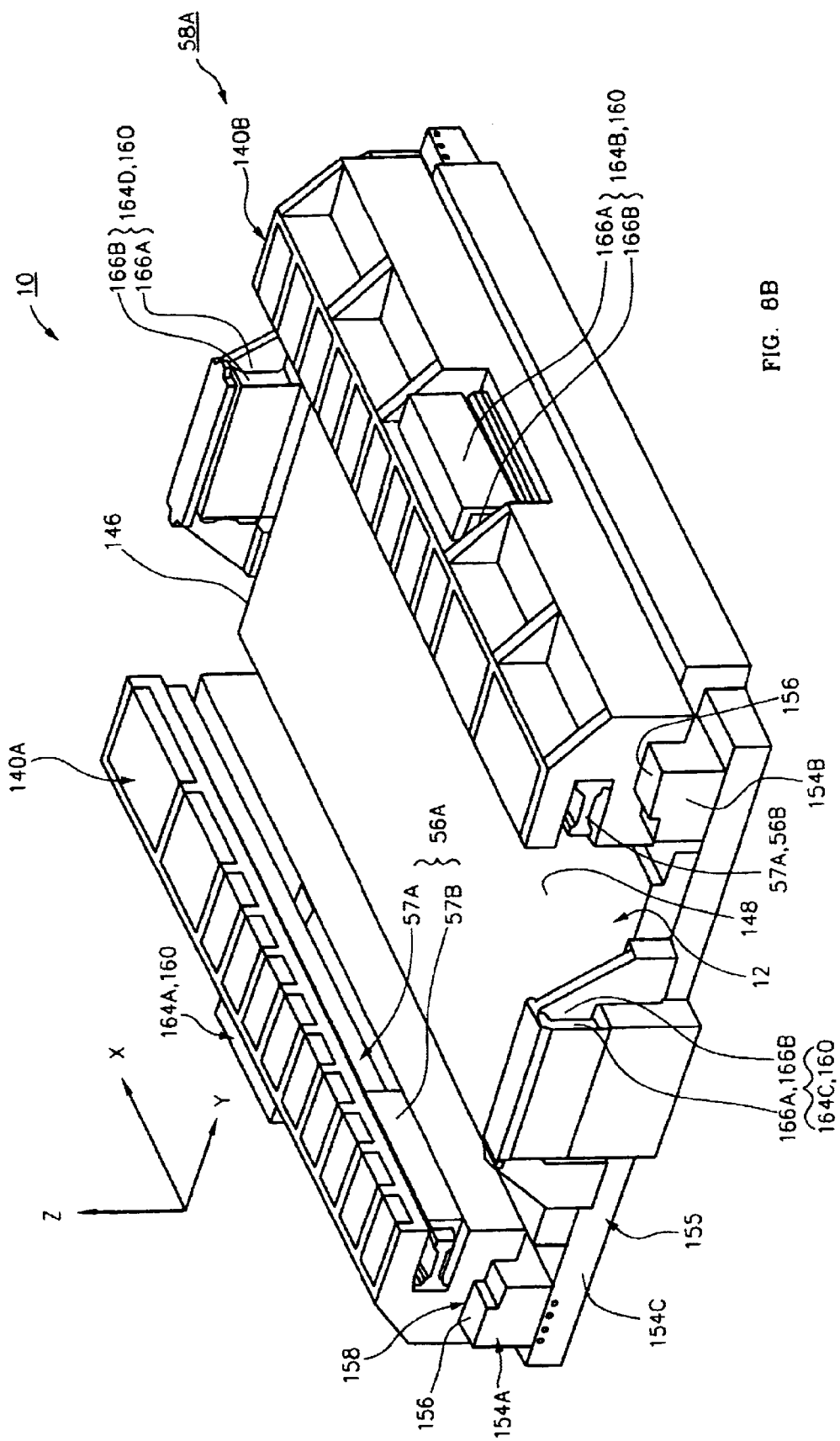
FIG. 8B is a perspective view of a portion of the stage assembly illustrated in FIG. 8A.
Figure 8C:
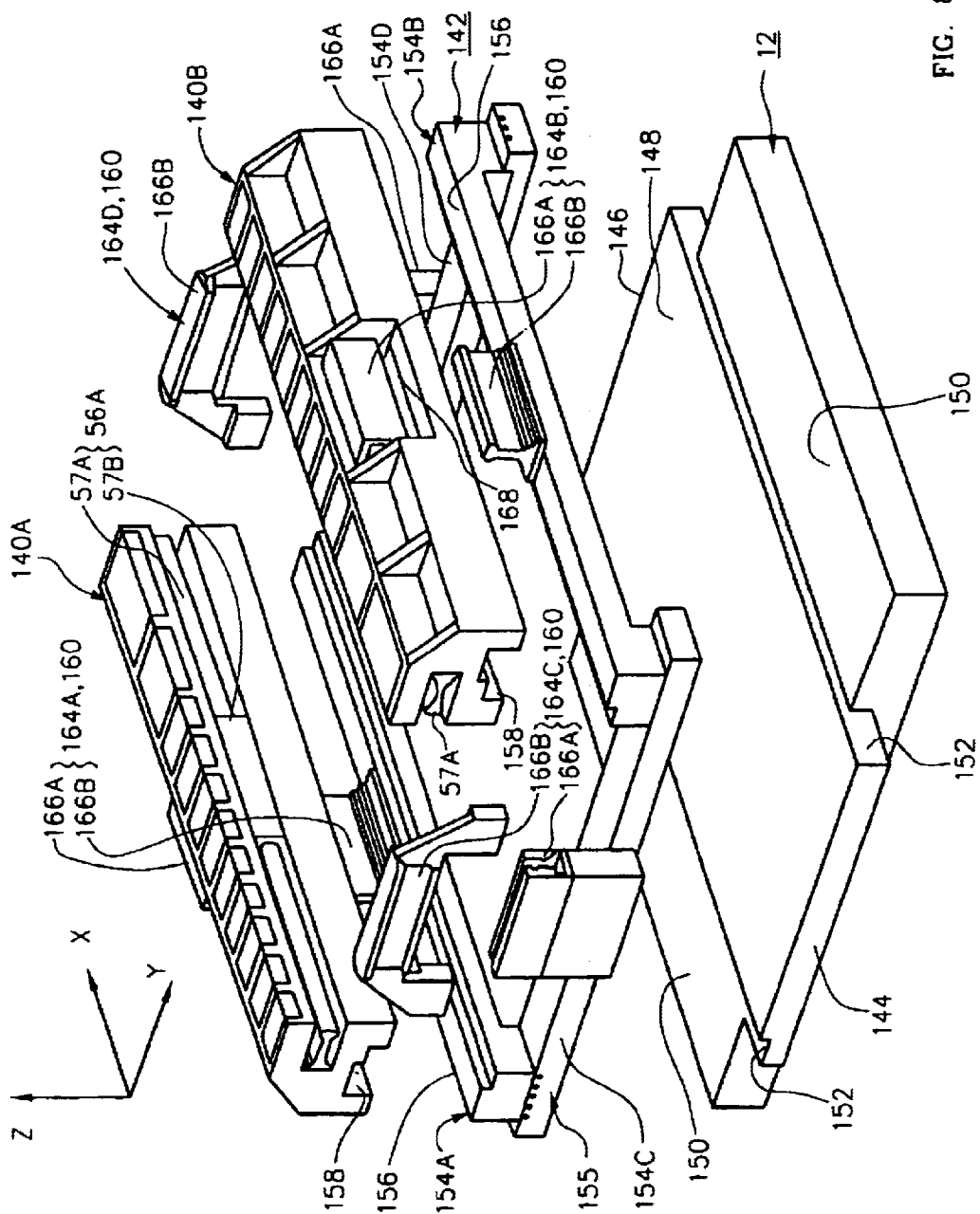
FIG. 8C is an exploded perspective view of the portion of the stage assembly of FIG. 8B.

A couple of alternate embodiments of the stage assembly 10 are illustrated in the Figures. In particular, FIGS. 1–2B illustrate a first embodiment of the stage assembly 10, FIG. 3 illustrates a portion of another embodiment of the stage assembly 10, FIGS. 4 and 5 illustrate a portion of yet another embodiment of the stage assembly 10, and FIGS. 8A–8C illustrate still another embodiment of the stage assembly 10. In some of the embodiments, the stage assembly 10 includes a single stage 14. Alternately, in other embodiments, the stage assembly 10 includes two stages 14 that are moved independently relative to the stage base 12. It should be noted that each of the embodiments could be designed to utilize two or more stages.

The stage base 12 supports the stage 14 above the mounting base 28. The design of the stage base 12 can be varied to suit the design requirements of the stage assembly 10. In the embodiment illustrated in FIG. 1, the stage base 12 is generally rectangular shaped and includes a planar base top 40 (sometimes referred to as a guide face), an opposed planar base bottom (not shown), and four base sides 42.

Figure 7:
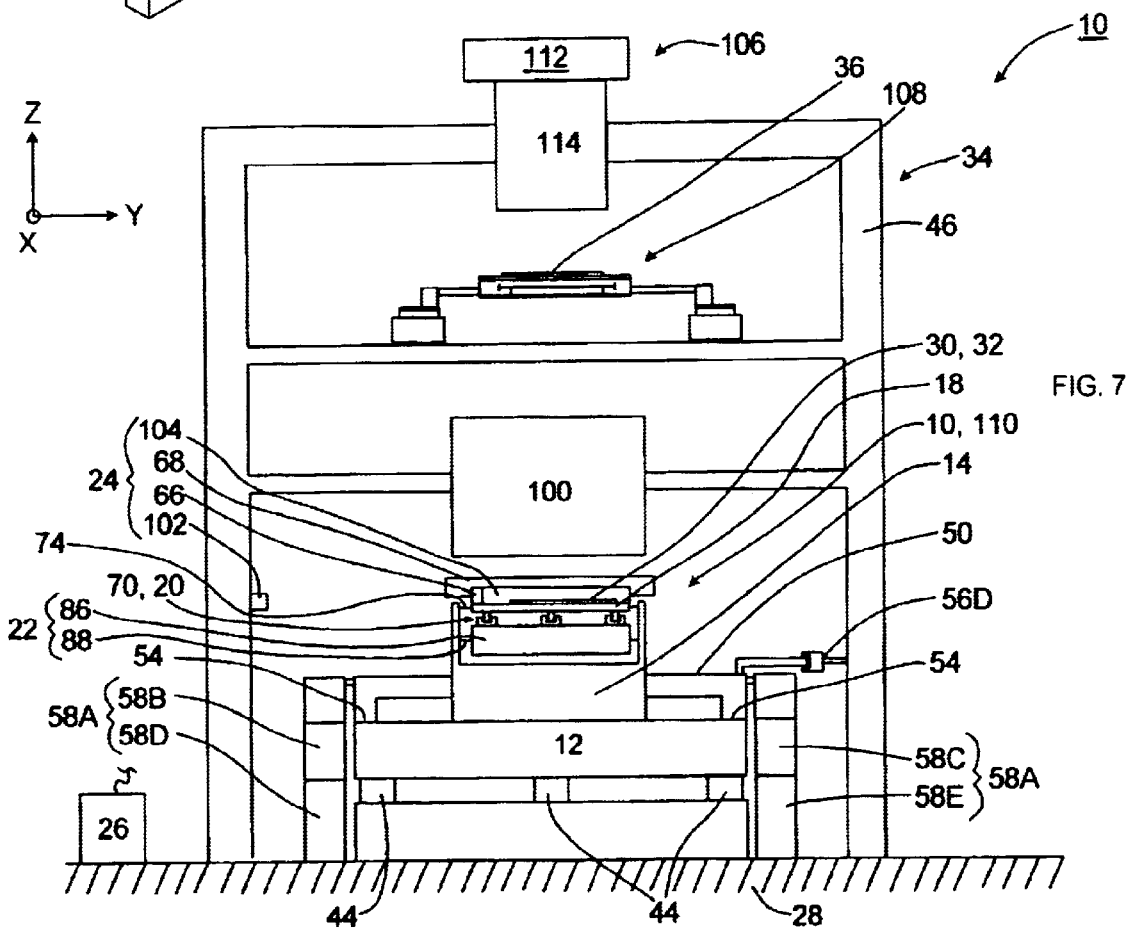
FIG. 7 is a simplified, side plan view of an exposure apparatus having features of the present invention.

Preferably, referring to FIG. 7, the stage base 12 is secured with resilient base isolators 44 and an apparatus frame 46 to the mounting base 28. The base isolators 44 reduce the effect of vibration of the apparatus frame 46 causing vibration on the stage base 12. Typically, three or four spaced apart base isolators 44 are utilized. Each base isolator 44 can include a pneumatic cylinder (not shown) and an actuator (not shown). Suitable base isolators 44 are sold by Technical Manufacturing Corporation, located in Peabody, Mass., or Newport Corporation located in Irvine, Calif.

The design and movement of the stage 14 can be varied to suit the design requirements of the stage assembly 10. In the embodiment illustrated in the Figures, the stage 14 moves relative to the stage base 12 along the X axis, along the Y axis and about the Z axis. Further, the stage 14 is somewhat rectangular shaped and includes a rectangular shaped opening for receiving a portion of a guide bar 50. More specifically, the stage 14 includes (i) a stage bottom (not shown), (ii) a planar shaped stage top 52A opposite from the stage bottom, (iii) a stage front side 52B, (iv) a stage rear side (not shown) substantially opposite from the stage front side 52B, (v) a stage left side 52C that extends above the stage top 52A and (vi) a stage right side 52D that is opposite from the stage left side 52C and extends above the stage top 52A.

A bearing (not shown) maintains the stage 14 spaced apart along the Z axis relative to the stage base 12 and allows for motion of the stage 14 along the X axis, along the Y axis and about the Z axis relative to the stage base 12. Preferably, the bearing is a vacuum preload type fluid bearing that maintains the stage 14 spaced apart from the stage base 12 in a non-contact manner. Alternately, the stage 14 can be supported spaced apart from the stage base 12 in other ways. For example, a magnetic type bearing or a ball bearing type assembly could be utilized that allows for motion of the stage 14 relative to the stage base 12.

Further, the stage 14 is maintained apart from the guide bar 50 with opposed bearings (not shown) that allow for motion of the stage 14 along the Y axis relative to the guide bar 50 and inhibit motion of the stage 14 relative to the guide bar 50 along the X axis and about the Z axis. Preferably, each bearing is a fluid bearing that maintains the stage 14 spaced apart from the guide bar 50 in a non-contact manner. Alternately, the stage 14 can be supported spaced apart from the guide bar 50 in other ways. For example, a magnetic type bearing or a ball bearing type assembly could be utilized that allows for motion of the stage 14 relative to the stage base 12.

The stage mover assembly 16 controls and moves the stage 14 relative to the stage base 12. The design of the stage mover assembly 16 and the movement of the stage 14 and the device table 18 can be varied to suit the movement requirements of the stage assembly 10. In the embodiment illustrated in FIG. 1, the stage mover assembly 16 moves the stage 14 and the device table 18 with a relatively large displacement along the X axis, a relatively large displacement along the Y axis, and a limited displacement about the Z axis (theta Z) relative to the stage base 12. In this embodiment, the stage mover assembly 16 includes the guide bar 50, a first X stage mover 56A (illustrated in phantom in FIG. 1), a second X stage mover 56B (illustrated in phantom in FIG. 1), a Y stage mover 56C (illustrated in phantom in FIGS. 1 and 2), and a Y guide mover 56D. More specifically, in this embodiment, (i) the X stage movers 56A, 56B move the guide bar 50, the stage 14 and the device table 18 with a relatively large displacement along the X axis and with a limited range of motion about the Z axis (theta Z), (ii) the Y stage mover 56C moves the stage 14 and the device table 18 with a relatively large displacement along the Y axis, and (iii) the Y guide mover 56D moves the guide bar 50 with a relatively small displacement along the Y axis.

The guide bar 50 moves the stage 14 along the X axis and about the Z axis and guides the movement of the stage 14 along the Y axis. The design of the guide bar 50 can be varied to suit the design requirements of the stage assembly 10. In the embodiment illustrated in the FIG. 1, the guide bar 50 is somewhat rectangular beam shaped and includes a pair of spaced apart guide pads 54. In this embodiment, each of the guide pads 54 includes a plurality of spaced apart fluid outlets (not shown), and a plurality of spaced apart fluid inlets (not shown). Pressurized fluid (not shown) is released from the fluid outlets towards the stage base 12 and vacuum is pulled in the fluid inlets to create a vacuum preload type fluid bearing between the guide bar 50 and the stage base 12. The vacuum preload type bearing allows for motion of the guide bar 50 relative to the stage base 12 along the X axis and about the Z axis.

The design of each mover 56A, 56B, 56C, 56D can be varied to suit the movement requirements of the stage assembly 10. As provided herein, each of the movers 56A, 56B, 56C, 56D can include one or more rotary motors, voice coil motors, linear motors, electromagnetic actuators, or some other force actuators. In the embodiment illustrated in FIG. 1, each of the movers 56A, 56B, 56C is a commutated, linear motor and the Y guide mover 56D is a voice coil motor. As provided herein, each of the movers 56A, 56B, 56C, 56D includes a first component 57A and an adjacent second component 57B that interacts with the first component 57A.

In the embodiment illustrated in FIG. 1, for each mover 56A, 56B, 56C, 56D, one of the components 57A, 57B includes one or more magnet arrays and the other component 57B, 57A includes one or more conductor arrays. Each magnet array includes one or more magnets (not shown). The design of each magnet array and the number of magnets in each magnet array can be varied to suit the design requirements of the movers 56A, 56B, 56C, 56D. Each magnet can be made of a permanent magnetic material such as NdFeB. Each conductor array includes one or more conductors (not shown). The design of each conductor array and the number of conductors in each conductor array is varied to suit the design requirements of the movers 56A, 56B, 56C, 56D. Each conductor can be made of metal such as copper or any substance or material responsive to electrical current and capable of creating a magnetic field such as superconductors.

Electrical current (not shown) is individually supplied to each conductor in each conductor array by the control system 26. For each mover 56A, 56B, 56C, 56D, the electrical current in each conductor interacts with a magnetic field (not shown) generated by one or more of the magnets in the magnet array. This causes a force (Lorentz force) between the conductors and the magnets.

Preferably, the damping assembly 22 includes a stage damper assembly 58A that reduces and minimizes the amount of reaction forces and disturbances from the stage mover assembly 16 that are transferred to the stage base 12 and the mounting base 28. This improves the positioning performance of the stage assembly 10. Further, for an exposure apparatus 34, this allows for more accurate positioning of the semiconductor wafer 32 relative to the reticle 36 (illustrated in FIG. 7).

The design of the stage damper assembly 58A can be varied to suit the design requirements of the stage assembly 10. In the embodiment illustrated in FIG. 1, the stage damping assembly 58A includes a first X reaction mass 58B and a second X reaction mass 58C. Referring to FIG. 7, the first X reaction mass 58B is supported with a first bearing (not shown) above a first X reaction frame 58D and the second X reaction mass 58C is supported with a second bearing (not shown) above a second X reaction frame 58E. The first bearing allows the first X reaction mass 58B to move relative to the first X reaction frame 58D along the X axis and the second bearing allows the second X reaction mass 58C to move relative to the second X reaction frame 58E along the X axis. The first bearing and the second bearing can, for example, be a fluid type bearing, a roller type bearing or a magnetic type bearing.

Referring back to FIG. 1, the first component 57A for the first X stage mover 56A is secured to the first X reaction mass 58B and the first component 57A for the second X stage mover 56B is secured to the second X reaction mass 58C. In this embodiment, when the stage mover assembly 16 applies a force to the stage 14 along the X axis, an equal and opposite force is applied to the stage damper assembly 58A. More specifically, through the principle of conservation of momentum, movement of the stage 14 with the X stage movers 56A, 56B along the X axis in one direction, moves the X reaction masses 58B, 58C in the opposite direction along the X axis. With this design, the reaction forces from the stage mover assembly 16 along the X axis are negated. This inhibits the reaction forces from the stage mover assembly 16 from influencing the position of the stage base 12.

The device table 18 retains the device 30. The design of the device table 18 can be varied to meet the design requirements of the stage assembly 10. In the embodiment illustrated in FIGS. 1–3, the device table 18 fits between the stage sides 52C, 52D, is generally rectangular plate shaped and includes a table top 60A, a table bottom 60B, four table sides 62, and a device holder 64 (illustrated in FIGS. 4 and 5). The device holder 64 is positioned near the table top 60A and retains the device 30 during movement of the stage 14. The device holder 64 can be a vacuum chuck, an electrostatic chuck, or some other type of clamp. Typically, the device table 18 also includes an X mirror 66 and a Y mirror 68 for the measurement system 24.

The table mover assembly 20 moves and adjusts the position of the device table 18 relative to the stage 14. The design of the table mover assembly 20 can be varied to suit the design requirements to the stage assembly 10. For example, in the embodiments illustrated in FIGS. 1–3, the table mover assembly 20 adjusts the position of the device table 18 relative to the stage 14 with three degrees of freedom. Alternately, for example, in the embodiment illustrated in FIGS. 4 and 5, the table mover assembly 20 adjusts the position of the device table 18 relative to the stage 14 with six degrees of freedom. As provided herein, the table mover assembly 20 can include one or more rotary motors, voice coil motors, linear motors, electromagnetic actuators, or other type of actuators.

FIGS. 1–3 illustrate a first embodiment of the table mover assembly 20. In this embodiment, the table mover assembly 20 moves the device table 18 about the X axis, about the Y axis and along the Z axis (collectively referred to as the "vertical degrees of freedom") relative to the stage 14. In this embodiment, the table mover assembly 20 includes a vertical mover assembly 70 having three, spaced apart, vertical movers 71 that selectively move the device table 18 about the X axis, about the Y axis and along the Z axis relative to the stage 14. The design of each vertical mover 71 can be varied to suit the movement requirements of the stage assembly 10. As provided herein, each vertical mover 71 includes a first Z component 72A and a second Z component 72B. In the embodiment illustrated in the FIGS. 1–3, each vertical mover 71 is a non-commutated actuator, commonly referred to as a voice coil actuator. For each vertical mover 71, the first Z component 72A is secured to the table bottom 60B of the device table 18 and the second Z component 72B is secured to the damping assembly 22. In this embodiment, the first Z component 72A of each vertical mover 71 includes a conductor array having a single conductor while the second Z component 72B includes a pair of spaced apart magnet arrays. Alternately, the configuration of the coil array and the magnet array can be reversed.

Electrical current (not shown) is individually supplied to each conductor in each conductor array by the control system 26. For each vertical mover 71, the electrical current in each conductor interacts with a magnetic field (not shown) generated by the one or more of the magnets in the magnet array. This causes a force (Lorentz force) between the conductors and the magnets that can be used to move the device table 18 relative to the stage 14.

As illustrated in FIGS. 2A and 2B, fluid bellows 76D can be utilized to support the dead weight of the device table 18. The fluid bellows 76D prevent overheating of the vertical movers 71. As provided herein, a fluid bellow 76D can be positioned next to each vertical mover 71. The bellows 76D have very low stiffness in all degrees of freedom so they do not significantly interfere with the control of the device table 18.

Alternately, referring to FIG. 3, resilient members 76E can be utilized to support the dead weight of the device table 18. The resilient members 76E prevent overheating of the vertical movers 71. As provided herein, a resilient member 76E can be positioned next to each vertical mover 71. Each resilient member 76E can be a spring 99 that has a very low stiffness in all degrees of freedom to not significantly interfere with the control of the device table 18.

Additionally, in the embodiment illustrated in FIGS. 1–3, a table guide 74 guides the movement of the device table 18 relative to the stage 14. The design of the table guide 74 can be varied. In this embodiment, the table guide 74 allows for movement of the device table 18 about the X axis, about the Y axis and along the Z axis relative to the stage 14 and inhibits movement of the device table 18 relative to the stage 14 along the X axis, along the Y axis and about the Z axis relative to the stage 14. Further, in this embodiment, the table guide 74 includes a first table connector 76A, a second table connector 76B, and a third table connector 76C that are spaced apart and extend between the stage 14 and the device table 18 and guide the movement of the device table 18 relative to the stage 14. The design and positioning of each of the table connectors 76A–76C can be varied. In the embodiment illustrated in FIGS. 1–3, each of the table connectors 76A–76C is a flexure, e.g. a flat, flexible piece of material, having a relatively high stiffness in some directions and relatively low stiffness in other directions. In the embodiment illustrated in FIGS. 1–3, the flexures (i) cooperate to have a relatively high stiffness along the X axis, along the Y axis and about the Z axis and (ii) are relatively flexible along the Z axis, about the X axis and about the Y. The ratio of relatively high stiffness to relatively low stiffness is at least approximately 100/1, and can be at least approximately 1000/1. In this embodiment, the first table connector 76A extends between the stage left side 52C and the device table 18, the second table connector 76B extends between the stage right side 52D and the device table 18, and the third table connector 76C extends between the stage right side 52D and the device table 18. Preferably, the spacing between adjacent table connectors 76A, 76B, 76C is approximately one hundred and twenty degrees. Each table connector 76A, 76B, 76C, for example, can be a flat leaf spring.

Alternately, for example, the table guide 74 can include one or more actuators, such as attraction only actuators, that guide the movement of the device table 18 relative to the stage 14.

As illustrated in FIG. 2B, the stage 14 includes three spaced apart stage beams 79A that extend inwardly and the device table 18 includes three spaced apart table beams 79B that extend outwardly from the device table 18. Each table connector 76A, 76B, 76C extends between one of the stage beams 79A and one of the table beams 79B.

FIGS. 4 and 5 illustrate an alternate embodiment of the table mover assembly 20. In this embodiment, the table mover assembly 20 adjusts and moves the device table 18 relative to the stage 14 with six degrees of freedom. In the embodiment illustrated in FIGS. 4 and 5, the table mover assembly 20 includes the vertical mover assembly 70 and a horizontal mover assembly 77. The horizontal mover assembly 77 moves the device table 18 along the X axis, along the Y axis and about the Z axis relative to the stage 14 and the vertical mover assembly 70 moves the device table 18 about the X axis, about the Y axis and along the Z axis relative to the stage 14.

Figure 6A:
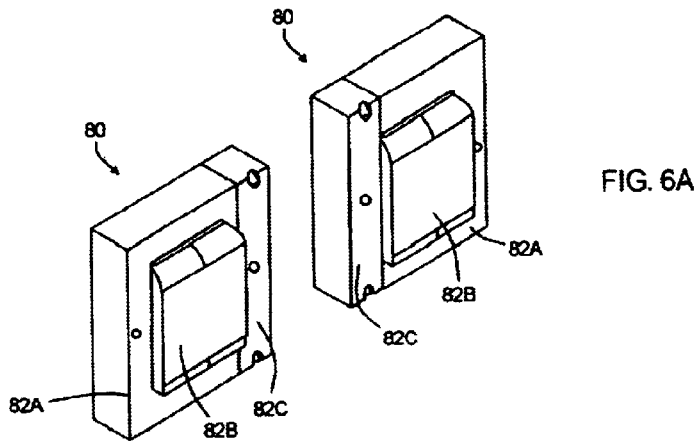
FIG. 6A illustrates a perspective view of a pair of electromagnetic actuators having features of the present invention.
Figure 6B:
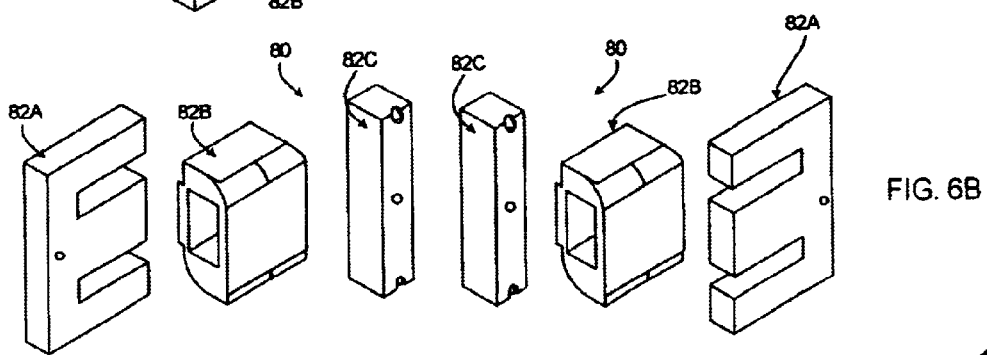
FIG. 6B illustrates an exploded perspective view of the actuators of FIG. 6A.

The design of each mover assembly 70, 77 can be varied. For example, the vertical mover assembly 70 can include three spaced apart vertical movers 71 and the horizontal mover assembly 77 can include three spaced apart horizontal movers 78. In the embodiment illustrated in the FIGS. 4 and 5, each of the horizontal movers 76 includes a pair of opposed electromagnetic actuators 80. FIGS. 6A and 6B illustrate a perspective view of a preferred pair of electromagnetic actuators 80. More specifically, FIG. 6A illustrates a perspective view of a pair of electromagnetic actuators 80 commonly referred to as E/I core actuators and FIG. 6B illustrates an exploded perspective view of the E/I core actuators. Each E/I core actuator is essentially an electromagnetic attractive device. Each E/I core actuator includes an E shaped core 82A, a tubular conductor 82B, and an I shaped core 82C. The E shaped core 82A and the I shaped core 82C are each made of a magnetic material such as iron, silicon steel or Ni—Fe steel. The conductor 82B is positioned around the center bar of the E shaped core 82A. The combination of the E shaped core 82A and the conductor 82B is sometimes referred to herein as an electromagnet. Further, the I shaped core 82C is sometimes referred to herein as a target.

Each electromagnet (E shaped core 82A) and target (I shaped core 82C) is separated by an air gap g (which is very small and therefore difficult to see in the figures). The electromagnets are variable reluctance actuating portions and the reluctance varies with the distance defined by the gap g, which, of course also varies the flux and force applied to the target. The attractive force between the electromagnet and the target is defined by:

$$F=K(i/g)^2$$

Where F is the attractive force, measured in Newtons;

K=an electromagnetic constant which is dependent upon the geometries of the E-shaped electromagnet, I-shaped target and number of conductor turns about the magnet. $K=\frac{1}{2}N^2\mu_o wd$; where N=the number of turns about the E-shaped magnet core; $\mu_o$=a physical constant of about $1.26\times10^{-6}$ H/m; w=the half width of the center of the E-shaped core in meters; and d=the depth of the center of the E-shaped core in meters. In a preferred embodiment, $K=7.73\times10^{-6}$ kg m$^3$/s$^2$A$^2$;

i=current, measured in amperes; and g=the gap distance, measured in meter.

Current (not shown) directed through the conductor 82B creates an electro-magnetic field that attracts the I shaped core 82C towards the E shaped core 82A. The amount of current determines the amount of attraction. Stated another way, when the conductor of an electromagnet is energized, the electromagnet generates a flux that produces an attractive force on the target in accordance with the formula given above, thereby functioning as a linear actuating portion. Because the electromagnets can only attract the targets, they must be assembled in pairs that can pull in opposition. The targets are fixed to the device table 18 and move relative to the stage 14. Opposing pairs of electromagnets are secured to the damping assembly 22 or the stage 14 on opposite sides of the targets. By making a current through the one conductor 82B of the pair of electromagnets larger than the current through the other conductor 82B in the pair, a differential force can be produced that draws the target in one direction or its opposing direction.

Preferably, the targets are attached to the device table 18 in such a way that the pulling forces of the opposing pair of electromagnets do not distort the device table 18. This is preferably accomplished by mounting the targets for an opposing pair of electromagnets very close to one another, preferably peripherally of the device table 18. Most preferred is to extend a thin web of material that is made of the same material as the device table 18. The opposing electromagnets are mounted to the damping assembly 22 or the stage 14 by a predetermined distance. When the web and targets are positioned there between, a predetermined gap g is formed between each set of electromagnet and target. With this arrangement, only the resultant force, derived from the sum of the forces produced by the pair of electromagnets and targets, is applied to the device table 18 via transfer of the force through the web. In this way, opposing forces are not applied to opposite sides of the device table 18 and distortion of the device table 18 resulting from that type of arrangement are avoided.

FIG. 5 illustrates a preferred arrangement of the horizontal movers 78. In this design, two opposing pairs of attraction only actuators (electromagnetic actuator) 80 are mounted so that the attractive forces produced thereby are substantially parallel with the X axis. One opposing pair of attraction only actuators 80 are mounted so that attractive forces from the pair are produced substantially parallel with the Y axis. With this arrangement, the horizontal movers 78 can make fine adjustments to the position of the device table 18 relative to the stage 14 along the X axis, along the Y axis, and about the Z axis (collectively referred to as "planar degrees of freedom"). More specifically, actuation of one pair of attraction only actuators 80 aligned along the Y axis can achieve fine movements of the device table 18 along the Y axis. Actuation of the two pairs of attraction only actuators 80 aligned along the X axis can control fine movements of the device table 18 along the X axis or in rotation (clockwise or counterclockwise) in the X-Y plane (i.e., Theta Z control). X axis movements are accomplished by resultant forces from both pairs that are substantially equal and in the same direction. Theta Z movements are generally accomplished by producing opposite directional forces from the two pairs of electromagnets, although unequal forces in the same direction will also cause some Theta Z adjustment.

Alternately, for example, two opposing pairs of attraction only actuators can be mounted parallel with the Y direction and one opposing pair of attraction only actuators could be mounted parallel with the X direction. Other arrangements are also possible, but the preferred arrangement minimizes the number of actuating portions/bearings required for the necessary degrees of control.

Preferably, the lines of force of the attraction only actuators 80 are arranged to act through the center of gravity of the device table 18. The two X pairs of attraction only actuators 80 are preferably equidistant from the center of gravity of the device table 18.

The vertical movers 71 are used to precisely position the device table 18 relative to the stage 14 along the Z axis, about the X axis and about the Y axis (collectively referred to as "vertical degrees of freedom"). Because control in the three vertical degrees of freedom requires less dynamic performance (e.g., acceleration requirements are relatively low) and is easier to accomplish, lower force requirements exist than in the previously described X, Y and theta Z degrees of freedom. Accordingly, each vertical mover 71 can be a voice coil motor having the first component 72A secured to the device table 18 and the second component 72B secured to the damping assembly 22.

Fluid bellows 84 (illustrated in phantom in FIG. 5) can be utilized to support the dead weight of the device table 18. The fluid bellows 84 prevent overheating of the vertical movers 71. As provided herein, a fluid bellow 84 is preferably positioned next to each vertical mover 71. The bellows 84 have very low stiffness in all degrees of freedom so they do not significantly interfere with the control of the device table 18.

The design and control of table mover assembly 20 illustrated in FIGS. 4 and 5 are more thoroughly described in co-pending U.S. patent application Ser. No. 09/022,713 filed Feb. 12, 1998, Ser. No. 09/139,954 filed Aug. 25, 1998, and Ser. No. 09/141,762 filed Aug. 27, 1998, each of which is hereby incorporated by reference thereto, in their entireties.

In the embodiments illustrated in the Figures, the damping assembly 22 also includes a table damping assembly 85 that reduces and minimizes the magnitude of reaction forces and disturbances from the table mover assembly 20 that are transferred to the stage 14, the stage base 12 and the mounting base 28. This improves the positioning performance of the stage assembly 10. Further, for an exposure apparatus 34, this allows for more accurate positioning of the semiconductor wafer 32 relative to a reticle 36 (illustrated in FIG. 7).

The design of the table damping assembly 85 can be varied to suit the design requirements of the stage assembly 10. In the embodiments illustrated herein, the table damping assembly 85 includes a Z reaction mass 86, a mass guide 88 and a mass trim 89. In this embodiment, the Z reaction mass 86 is generally rectangular block shaped and includes a mass top 90A, an opposed mass bottom 90B and four mass sides 90C. Referring back to FIGS. 1–3, in these embodiments, the second component 72B for each vertical mover 71 is secured to the mass top 90A of the Z reaction mass 86. Somewhat similarly, in the embodiment illustrated in FIGS. 4 and 5, a portion of the vertical movers 71 and a portion of the horizontal movers 76 are connected and attached to the Z reaction mass 86. Alternately, in the embodiment illustrated in FIGS. 4 and 5, the horizontal movers 78 may be secured to the stage 14 instead of the Z reaction mass 86. In these embodiments, when the table mover assembly 20 applies a force to the device table 18 along the Z axis, about the X axis and about the Y axis, an equal and opposite force is applied to the table damping assembly 85. More specifically, through the principle of conservation of momentum, movement of the device table 18 with the vertical movers 71 along the Z axis, about the X axis and about the Y axis moves the Z reaction mass 86 in substantially the opposite direction. With this design, the reaction forces from the table mover assembly 20 along the vertical degrees of freedom are negated. This inhibits the reaction forces from the table mover assembly 20 from influencing the position of the stage base 12.

For each of the embodiments provided herein, the ratio of the mass of the Z reaction mass 86 to the mass of the device table 18 is approximately 1:1 or less because of the stroke of the table mover assembly 20 is relatively small along the Z axis and the stroke of the Z reaction mass 86 is not critical However, a larger mass ratio may be better for other uses of the stage assembly 10.

The amount of movement of the Z reaction mass 86 will vary according to the design of the table mover assembly 20. In the embodiments illustrated herein, the Z reaction mass 86 is able to move between approximately 0.5 mm and 5 mm along the Z axis.

The mass guide 88 guides the movement of the Z reaction mass 86 relative to the stage 14. The design of mass guide 88 can be varied to suit the design requirements of the stage assembly 10. In the embodiments illustrated herein, the mass guide 88 allows for movement of the Z reaction mass 86 about the X axis, about the Y axis and along the Z axis relative to the stage 14 and inhibits movement of the Z reaction mass 86 relative to the stage 14 along the X axis, along the Y axis and about the Z axis. Further, in these embodiments, the mass guide 88 includes a first mass connector 92A, a second mass connector 92B, and a third mass connector 92C that are spaced apart and extend between the stage 14 and the Z reaction mass 86 and guide the movement of the Z reaction mass 86 relative to the stage 14. The design and positioning of each of the mass connectors 92A–92C can be varied. In the embodiments illustrated in FIGS. 1–3, each of the mass connectors 92A–92C is a flexure, e.g. a flat, flexible piece of material, having a relatively high stiffness in some directions and relatively low stiffness in other directions. In the embodiments illustrated in FIGS. 1–3, the flexures (i) cooperate to have a relatively high stiffness along the X axis, along the Y axis and about the Z axis and (ii) are relatively flexible along the Z axis, about the X axis and about the Y. The ratio of relatively high stiffness to relatively low stiffness is at least approximately 100/1, and can be at least approximately 1000/1. In this embodiment, (i) the first mass connector 92A extends between the stage left side 52C and one of the mass sides 90C, (ii) the second mass connector 92B extends between the stage right side 52D and one of the mass sides 90C, and (iii) the third mass connector 92C extends between the stage right side 52D and the one of the mass sides 90C. Preferably, the spacing between adjacent mass connectors 92A, 92B, 92C is approximately one hundred and twenty degrees. Each mass connector 92A, 92B, 92C for example, can be a flat leaf spring. Alternately, for example, the mass guide 88 can include one or more actuators, such as an attraction only actuator, that guide the movement of the Z reaction mass 86 relative to the stage 14.

As illustrated in FIG. 2B, the stage 14 includes three spaced apart stage beams 95A (only two are illustrated in FIG. 2B) that extend inwardly and the Z reaction mass 86 includes three spaced apart mass beams 95B that extend outwardly from the Z reaction mass 86. Each mass connector 92A, 92B, 92C extends between one of the stage beams 95A and one of the mass beams 95B.

Uniquely, the Z reaction mass 86 provided herein is free to move with at least one, and more preferably three, degrees of freedom. More specifically, the Z reaction mass 86 is free to move along the Z axis, about the X axis, and about the Y axis relative to the stage 14 and stage base 12. This design allows the Z reaction mass 86 to reduce and minimize the amount of reaction forces from the table mover assembly 20 that is transferred to the stage 14, stage base 12 and to the mounting base 28.

The mass trim 89 is used to make minor corrections to the position of the Z reaction mass 86 so that the Z reaction mass 86 does not drift away and so that the Z reaction mass 86 is correctly positioned during operation of the stage assembly 10. Disturbances such as cable forces (not shown) can cause the Z reaction mass 86 to become incorrectly positioned. The mass trim 89 corrects the position of the Z reaction mass 86 so that the Z reaction mass 86 is properly positioned along the Z axis, about the X axis and about the Y axis. The design of the mass trim 89 can be varied to suit the design requirements of the table damping assembly 85. In the embodiment illustrated in FIGS. 1–2B, the mass trim 89 includes three spaced apart trim movers 96 and three spaced apart fluid bellows 97. However, the mass trim 89 could include less than three or more than three trim movers 96 and/or less than three or more than three fluid bellows 97. Further, for example, the mass trim 89 may not utilize the fluid bellows 97.

The design of each trim mover 96 can be varied to suit the movement requirements of the mass trim 89. As provided herein, each of the trim movers 96 can include one or more rotary motors, voice coil motors, linear motors, electromagnetic actuators, or some other force actuators. In the embodiment illustrated in FIGS. 1–3, each of the trim movers 96 is a non-commutated, linear motor, commonly referred to as a voice coil motor. As provided herein, each of the trim movers 96 includes a first component 98A and an adjacent second component 98B that interacts with the first component 98A.

For each mover 96, one of the components 98A, 98B includes one or more magnet arrays and the other component 98B, 98A includes one or more conductor arrays. Each magnet array includes one or more magnets (not shown). The design of each magnet array and the number of magnets in each magnet array can be varied to suit the design requirements of the trim movers 96. Each magnet can be made of a permanent magnetic material such as NdFeB. Each conductor array includes one or more conductors (not shown). The design of each conductor array and the number of conductors in each conductor array is varied to suit the design requirements of the trim movers 96. Each conductor can be made of metal such as copper or any substance or material responsive to electrical current and capable of creating a magnetic field such as superconductors.

Electrical current (not shown) is individually supplied to each conductor in each conductor array by the control system 26. For each trim mover 96, the electrical current in each conductor interacts with a magnetic field (not shown) generated by one or more of the magnets in the magnet array. This causes a force (Lorentz force) between the conductors and the magnets.

In this embodiment, the first component 98A of each trim mover 96 includes a conductor array (not shown), while the second component 98B of each trim mover 96 includes a pair of spaced apart magnet arrays (not shown). With this design, the trim movers 96 can independently make corrections to the positions of the Z reaction mass 86 along the Z axis, about the X axis and the about the Y axis relative to the stage 14. Alternately, for example, the first component of each trim mover 96 could include a pair of spaced apart magnet arrays while the second component of each trim mover 96 could include a conductor array.

The fluid bellows 97 extend between the stage 14 and the Z reaction mass 86 and are utilized to support the dead weight of the Z reaction mass 86. The fluid bellows 97 prevent overheating of the trim movers 96. As provided herein, a fluid bellow 97 is preferably positioned next to each trim mover 96. The bellows 97 have very low stiffness in all degrees of freedom so they do not significantly interfere with the control of the Z reaction mass 86.

Alternately, referring to FIG. 3, each mass trim 89 can include one or more resilient members 99, such as a spring. In this embodiment, the mass trim 89 includes three spaced apart resilient members 99.

Preferably, the measurement system 24 (illustrated as a block in FIGS. 2A–3) monitors the position of the Z reaction mass 86 and the device table 18. With this information, the trim movers 96 can be used to precisely correct the position of the Z reaction mass 86. The design of the measurement system 24 can be varied. For example, the measurement system 24 can utilize laser interferometers, encoders, sensors, and/or other measuring devices to monitor the positions of the Z reaction mass 86 and the device table 18. In the embodiments illustrated in FIGS. 1–3, the measurement system 24 monitors the position of the device table 18 and the Z reaction mass 86 along the Z axis, about the X axis and about the Y axis. A suitable encoder or interferometer can be made with components obtained from Agilent Technologies in Palo Alto, Calif.

Referring to FIG. 7, the measurement system 24 also monitors movement of the device table 18 relative to an optical assembly 100 or some other reference. With this information, the stage mover assembly 16 and the table mover assembly 20 can be used to precisely position the device 30.

In the embodiment illustrated in FIG. 7, the measurement system 24 also monitors the position of the device table 18 along the X axis, along the Y axis, along the Z axis, about the X axis, about the Y axis and about the Z axis. In this embodiment, the measurement system 24 utilizes a linear encoder (not shown) that measures the amount of movement of stage 14 relative to the guide bar 50. Additionally, the measurement system 24 includes an X interferometer 102 and a Y interferometer 104 to monitor the position of the device table 18. The X interferometer 102 generates a laser beam toward to the X mirror 86 and detects the beam that is reflected off of the X mirror 86. With this information, the location of the device table 18 along the X axis can be monitored. The Y interferometer 104 generates a pair of laser beams toward to the Y mirror 68 and detects the beams that are reflected off of the Y mirror 68. With this information, the location of the device table 18 along the Y axis and about the Z axis can be monitored.

The control system 26 is connected to each conductor of X stage movers 56A, 56B, and the Y stage mover 56C, and the Y guide mover 56D, and the table mover assembly 20, and the trim mover 96 respectively. Further, the control system 26 is connected to the measurement system 24. The control system 26 receives information from the measurement system 24 and controls the stage mover assembly 16 and the table mover assembly 20 to precisely position the device table 18 and the device 30. In the embodiment illustrated in FIGS. 1–3, the control system 26 directs and controls the current to the conductor array for each of the X stage mover 56A, 56B to control movement of the stage 14 along the X axis and about the Z axis. Similarly, the control system 26 directs and controls the current to conductor array for the Y stage mover 56C and the Y guide mover 56D to control movement of the stage 14 along the Y axis. Also, the control system 26 directs and controls the current to the conductors of the table mover assembly 20 to control the position of the device table 18 relative to the stage 14.

FIG. 7 is a schematic view illustrating an exposure apparatus 34 useful with the present invention. The exposure apparatus 34 includes the apparatus frame 46, an illumination system 106 (irradiation apparatus), a reticle stage assembly 108, the optical assembly 100 (lens assembly), and a wafer stage assembly 110. The stage assemblies 10 provided herein can be used as the wafer stage assembly 110. Alternately, with the disclosure provided herein, the stage assemblies 10 provided herein can be modified for use as the reticle stage assembly 108.

The exposure apparatus 34 is particularly useful as a lithographic device that transfers a pattern (not shown) of an integrated circuit from the reticle 36 onto the semiconductor wafer 32. The exposure apparatus 34 mounts to the mounting base 28, e.g., the ground, a base, or floor or some other supporting structure.

The apparatus frame 46 is rigid and supports the components of the exposure apparatus 34. The design of the apparatus frame 46 can be varied to suit the design requirements for the rest of the exposure apparatus 34. The apparatus frame 46 illustrated in FIG. 7 supports the optical assembly 100 and the illumination system 106 and the reticle stage assembly 108 above the mounting base 28

The illumination system 106 includes an illumination source 112 and an illumination optical assembly 114. The illumination source 112 emits a beam (irradiation) of light energy. The illumination optical assembly 114 guides the beam of light energy from the illumination source 112 to the optical assembly 100. The beam illuminates selectively different portions of the reticle 36 and exposes the semiconductor wafer 32. In FIG. 7, the illumination source 112 is illustrated as being supported above the reticle stage assembly 108. Typically, however, the illumination source 112 is secured to one of the sides of the apparatus frame 46 and the energy beam from the illumination source 112 is directed to above the reticle stage assembly 108 with the illumination optical assembly 114.

The optical assembly 100 projects and/or focuses the light passing through the reticle to the wafer. Depending upon the design of the exposure apparatus 34, the optical assembly 100 can magnify or reduce the image illuminated on the reticle.

The reticle stage assembly 108 holds and positions the reticle relative to the optical assembly 100 and the wafer. Similarly, the wafer stage assembly 110 holds and positions the wafers with respect to the projected image of the illuminated portions of the reticle in the operational area. In FIG. 7, the wafer stage assembly 110 utilizes a stage assembly 10 having features of the present invention. Depending upon the design, the exposure apparatus 34 can also include additional motors to move the stage assemblies 108, 110.

There are a number of different types of lithographic devices. For example, the exposure apparatus 34 can be used as scanning type photolithography system that exposes the pattern from the reticle onto the wafer with the reticle and the wafer moving synchronously. In a scanning type lithographic device, the reticle is moved perpendicular to an optical axis of the optical assembly 100 by the reticle stage assembly 108 and the wafer is moved perpendicular to an optical axis of the optical assembly 100 by the wafer stage assembly 110. Scanning of the reticle and the wafer occurs while the reticle and the wafer are moving synchronously.

Alternately, the exposure apparatus 34 can be a step-and-repeat type photolithography system that exposes the reticle while the reticle and the wafer are stationary. In the step and repeat process, the wafer is in a constant position relative to the reticle and the optical assembly 100 during the exposure of an individual field. Subsequently, between consecutive exposure steps, the wafer is consecutively moved by the wafer stage assembly 110 perpendicular to the optical axis of the optical assembly 100 so that the next field of the wafer is brought into position relative to the optical assembly 100 and the reticle for exposure. Following this process, the images on the reticle are sequentially exposed onto the fields of the wafer so that the next field of the wafer is brought into position relative to the optical assembly 100 and the reticle.

However, the use of the exposure apparatus 34 and the stage assembly 10 provided herein are not limited to a photolithography system for semiconductor manufacturing. The exposure apparatus 34, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, machine tools, metal cutting machines, inspection machines and disk drives.

The illumination source 112 can be g-line (436 nm), i-line (365 nm), KrF excimer laser (248 nm), ArF excimer laser (193 nm) and $F_2$ laser (157 nm). Alternately, the illumination source 112 can also use charged particle beams such as an x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of the optical assembly 100 included in the photolithography system, the optical assembly 100 need not be limited to a reduction system. It could also be a 1× or magnification system.

With respect to an optical assembly 100, when far ultra-violet rays such as the excimer laser is used, glass materials such as quartz and fluorite that transmit far ultra-violet rays is preferable to be used. When the $F_2$ type laser or x-ray is used, the optical assembly 100 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No.8-171054 published in the Official Gazette for Laid-Open Patent Applications and its counterpart U.S. Pat. No, 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No.8-334695 published in the Official Gazette for Laid-Open Patent Applications and its counterpart U.S. Pat. No. 5,689,377 as well as Japan Patent Application Disclosure No.10-3039 and its counterpart U.S. Pat. No. 5,892,117 also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

FIGS. 8A–8C illustrate yet another embodiment of a stage assembly 10 having features of the present invention. In particular, FIG. 8A illustrates a perspective view of the stage assembly 10, FIG. 8B illustrates a perspective view of the stage damper assembly 58A, and FIG. 8C illustrates an exploded perspective view of the stage damper assembly 58A. The stage assembly 10 illustrated in FIG. 8A includes the stage base 12, a pair of stages 14, the stage mover assembly 16, the table damping assembly 85, and the control system 26. The measurement system is not illustrated in FIG. 8A. The stage damper assembly 58A illustrated in FIGS. 8A–8C dampens vibration along the X axis, along the Y axis and about the Z axis.

In the embodiment illustrated in FIG. 8A, each stage 14, the stage mover assembly 16, the table damping assembly 85, and the control system 26 are somewhat similar to the equivalent components described above. However, in the embodiment illustrated in FIGS. 8A–8C, the stage base 12 and the stage damper assembly 58A differ from the embodiments described above. In the embodiment illustrated in FIGS. 8A–8C, the stage damper assembly 58A includes a first X reaction mass 140A, a second X reaction mass 140B, and a Y reaction mass assembly 142.

As can best be seen with reference to FIGS. 8B and 8C, in this embodiment, the stage base 12 is somewhat rectangular shaped and includes a front lip 144, a rear lip 146, a raised central section 148, and a pair of spaced apart upper edge sections 150. The front lip 144 cantilevers away from a front side of the stage base 12, and the rear lip 146 cantilevers away from a rear side of the stage base 12. The raised central section 148 separates the upper edge sections 150. The raised central section 148 includes a pair of spaced apart section sides 152.

The Y reaction mass assembly 142 includes the a rectangular shaped, Y reaction frame 155 having a first frame side 154A, a second frame side 154B, a front frame side 154C, and a rear frame side 154D.

The first frame side 154A and the second frame side 154B each include an X mass guide 156 for guiding the X reaction masses 140A, 140B. Each X reaction mass 140A, 140B includes an X follower 158. In this embodiment, each X mass guide 156 cooperates with the X follower 158 of one of the X reaction masses 140A, 140B, to guide the movement of the X reaction masses 140A, 140B along the X axis relative to the Y reaction frame 155 and stage base 12. In the embodiments provided herein, the first and second frame sides 154A, 154B are each somewhat rectangular beam shaped and each X follower 158 is a channel that extends along the X axis in each of the X reaction masses 140A, 140B. The front and rear frame sides 154C, 154D are also generally rectangular shaped.

Pressurized fluid is released and a vacuum is created between the first and second frame sides 154A, 154B and the X reaction masses 140A, 140B to create a vacuum preload type fluid bearing (not shown). The vacuum preload type fluid bearing maintains the X reaction masses 140A, 140B spaced apart from the Y reaction frame 155 and allows for independent relative motion of the X reaction masses 140A, 140B along the X axis relative to the Y reaction frame 155 and stage base 12. Alternately, the X reaction masses 140A, 140B can be supported above the Y reaction frame 155 by other ways such as a magnetic type bearing (not shown) or a ball bearing type assembly (not shown).

It should be noted in this embodiment, that the X reaction masses 140A, 140B and the Y reaction frame 155 move concurrently along the Y axis to dampen vibration along the Y axis.

In the design provided in FIGS. 8A–8C, the first frame side 154A and the second frame side 154B are positioned above the upper edge sections 150 and are separated by the raised central section 148. Further, the front frame side 154C is positioned below the front lip 144, and the rear frame side 154D is positioned below the rear lip 146. In the embodiment illustrated in FIGS. 8A–8C, the stage base 12 supports the Y reaction frame 155. More specifically, in this embodiment, pressurized fluid (not shown) is released and a vacuum is pulled in fluid inlets (not shown) to create a vacuum preload type fluid bearing between the stage base 12 and the Y reaction frame 155. The vacuum preload type, fluid bearing maintains the Y reaction frame 155 spaced apart from the stage base 12 along the X axis and along the Z axis. With this design, the vacuum preload type fluid bearing allows for motion of the Y reaction frame 155 along the Y axis relative to the stage base 12. Further, the fluid bearing inhibits movement of the Y reaction frame 155 relative to the stage base 12 along the X axis, along the Z axis, and about the X, Y and Z axes.

Alternately, the Y reaction frame 155 can be supported spaced apart from the stage base 12 by other ways. For example, a magnetic type bearing (not shown) or a ball bearing type assembly (not shown) could be utilized that allows for motion of the Y reaction frame 155 relative to the stage base 12.

In this embodiment, the first component 57A of the first X stage mover 56A is secured to and moves with the first X reaction mass 140A, and the first component 57A of the second X stage mover 56B is secured to and moves with the second X reaction mass 140B.

In this embodiment, a reaction mover assembly 160 can be used to make minor corrections along the Y axis to the position of the Y reaction mass assembly 142 relative to the stage base 12. Further, the reaction mover assembly 160 can be used to independently make corrections to the position of the X reaction masses 140A, 140B along the X axis relative to the Y reaction frame 155. In the embodiment, the reaction mover assembly 160 includes a first X reaction mover 164A, a second X reaction mover 164B, a first Y reaction mover 164C, and a second Y reaction mover 164D, that cooperate to move the stage damper assembly 58A relative to the stage base 12.

The design of each reaction mover 164A–164D can vary. For example, each of the reaction movers 164A–164D includes a first component 166A and an adjacent, second component 166B. In the embodiments provided herein, one of the components 166A, 166B of each reaction mover 164A–164D includes one or more magnet arrays (not shown) and the other component 166B, 166A of each mover 164A–164D includes one or more conductor arrays (not shown). Electrical current (not shown) is individually supplied to each conductor array by the control system 26. For each reaction mover 164A–164D, the electrical current in each conductor interacts with a magnetic field (not shown) generated by one or more of the magnets in the magnet array. This causes a force (Lorentz force) between the conductors and the magnets.

Specifically, in the embodiment illustrated in the FIGS. 8A–8C, each X reaction mover 164A, 164B is a commutated, linear motor. For the first X reaction mover 164A, the first component 166A is secured to the first X reaction mass 140A while the second component 166B is secured to the first frame side 154A of the Y reaction frame 155. Similarly, for the second X reaction mover 164B, the first component 166A is secured to the second X reaction mass 140B while the second component 166B is secured to the second frame side 154B of the Y reaction frame 155.

It should be noted in this embodiment that each X reaction mass 140A, 140B includes a mass aperture 168 (only one is illustrated), and that the second component 166B of each X reaction mover 164A, 164B extends through the mass aperture 168.

In this embodiment, the first component 166A of each X reaction mover 164A, 164B includes a pair of spaced apart magnet arrays (not shown) while the second component 166B of each X reaction mover 164A, 164B includes a conductor array (not shown). With this design, the X reaction movers 164A, 164B can make minor corrections to the positions of the X reaction masses 140A, 140B along the X axis relative to the Y reaction frame 155 and the stage base 12. Alternately, for example, the first component of each X reaction mover could include a conductor array while the second component of each X reaction mover could include a pair of spaced apart magnet arrays.

The X reaction movers 164A, 164B can include a measurement device (not shown) such as an encoder that provides information regarding the position of the X reaction masses 140A, 140B relative to the Y reaction frame 155 and the stage base 12 along the X axis.

Somewhat similarly, in the embodiment illustrated in FIGS. 8A–8C, each Y reaction mover 164C, 164D is a commutated, linear motor. For each of the Y reaction movers 164C, 164D, the first component 166A is secured to the Y reaction frame 155, while the second component 166B is secured to the stage base 12 or preferably to the mounting base 24. More specifically, for the first Y reaction mover 164C, the first component 166A is secured to the front frame side 154C, and the second component 166B is secured to the front lip 144. Similarly, for the second Y reaction mover 164D, the first component 166A is secured to the rear frame side 154D, and the second component 166B is secured to the rear lip 146.

In this embodiment, the first component 166A of each Y reaction mover 164C, 164D includes a pair of spaced apart magnet arrays (not shown) while the second component 166B of each Y reaction mover 164C, 164D includes a conductor array (not shown). With this design, the Y reaction movers 164C, 164D can make minor corrections to the position of the Y reaction frame 155 and the X reaction masses 140A, 140B along the Y axis relative to the stage base 12. Alternately, for example, the first component of each Y reaction mover could include a conductor array while the second component of each Y reaction mover could include a pair of spaced apart magnet arrays.

The Y reaction movers 164C, 164D can include a measurement device (not shown) such as an encoder that provides information regarding the position of the Y reaction frame 155 relative to the stage base 12 along the Y axis.

In summary, the mover assembly 15 moves the device table 18 relative to the stage base 12 with at least four degrees of freedom and more specifically six degrees of freedom, e.g. along the X, Y and Z axes and about the X, Y and Z axes. In this embodiment, the damping assembly 22 is coupled to the mover assembly 15 and reduces the reaction forces that are transferred to the stage base 12 with at least four degrees of freedom and more specifically six degrees of freedom. Stated another way, the embodiment illustrated in FIGS. 8A–8C includes reaction masses that move and dampen vibration in six degrees of freedom.

A more complete discussion of additional alternate embodiments of the stage damper assembly that utilize reaction masses that move along the X axis and along the Y axis can be found in U.S. patent application Ser. No. 09/714,747, filed on Nov, 16, 2000, entitled "Stage Assembly Including A Reaction Mass Assembly". As far as is permitted, the disclosure in U.S. patent application Ser. No. 09/714,747 is incorporated herein by reference.

Figure 9A:
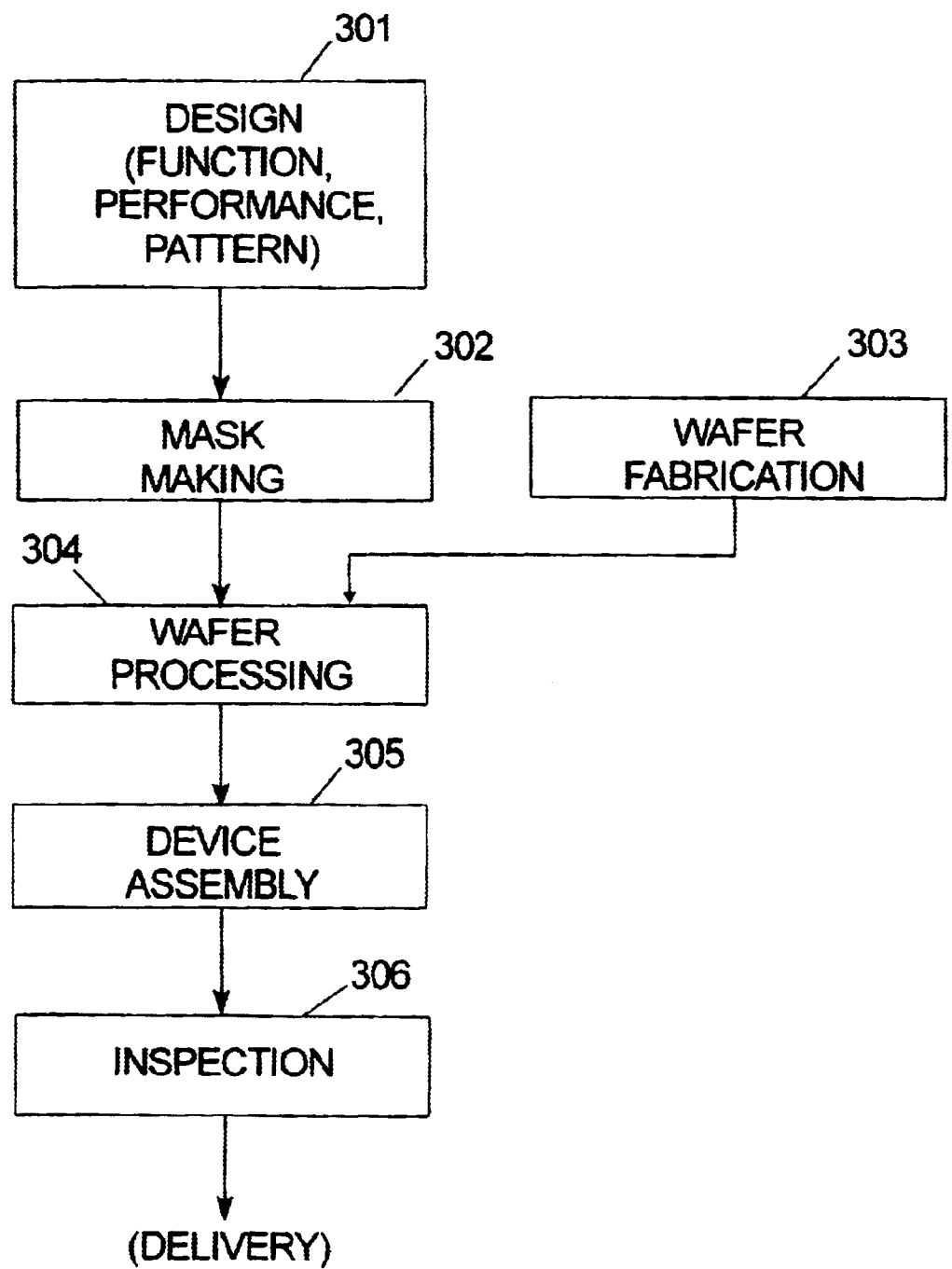
FIG. 9A is a flow chart that outlines a process for manufacturing a device in accordance with the present invention.

Semiconductor devices can be fabricated using the above described systems, by the process shown generally in FIG. 9A. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process and packaging process), finally, the device is then inspected in step 306.

Figure 9B:
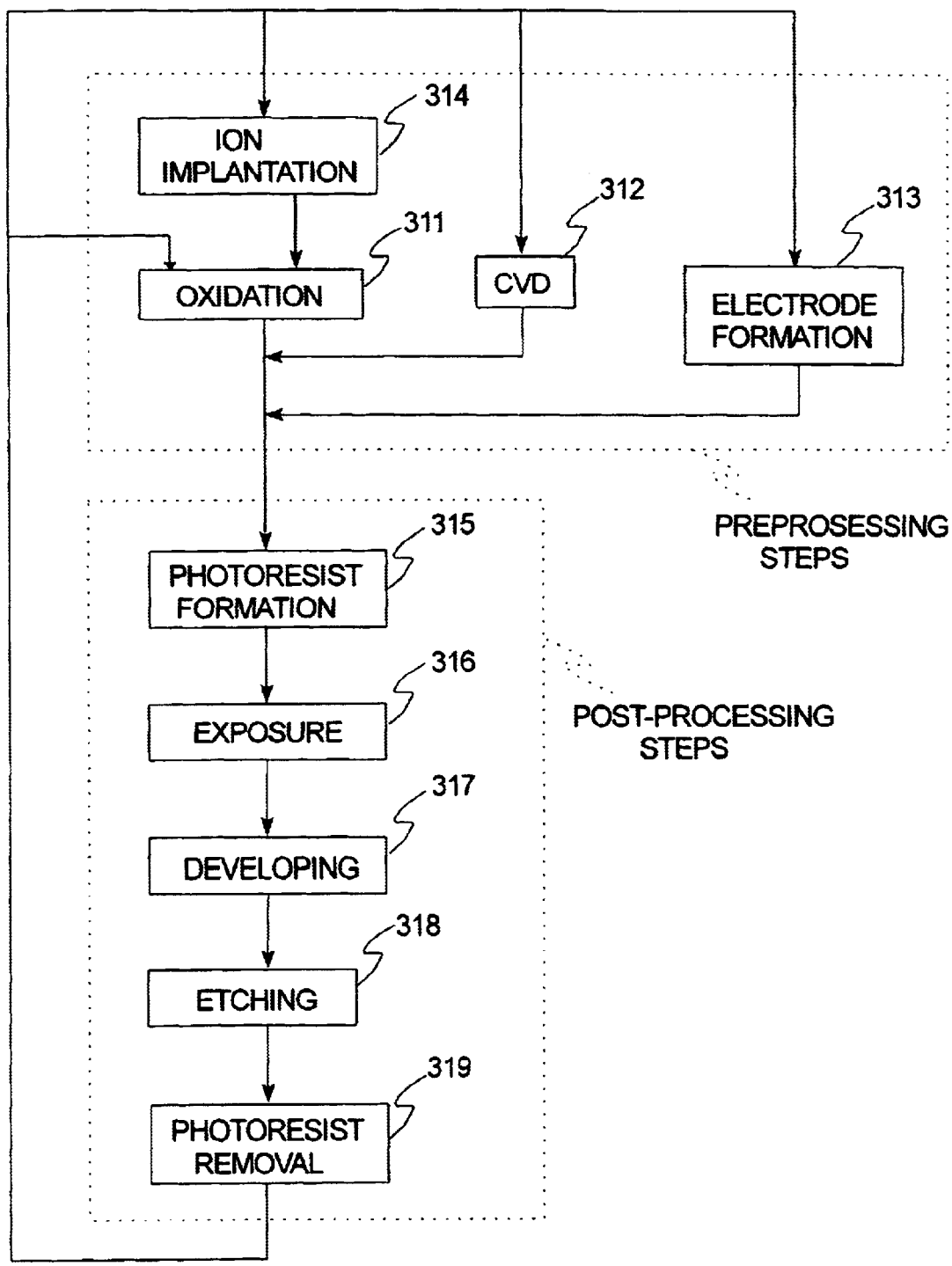
FIG. 9B is a flow chart that outlines device processing in more detail.

FIG. 9B illustrates a detailed flowchart example of the above-mentioned step 304 in the case of fabricating semiconductor devices. In FIG. 9B, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 315 (photoresist formation step), photoresist is applied to a wafer. Next, in step 316 (exposure step), the above-mentioned exposure device is used to transfer the circuit pattern of a mask (reticle) to a wafer. Then in step 317 (developing step), the exposed wafer is developed, and in step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

While the particular stage assembly 10 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly that moves a device, the stage assembly comprising:
   a stage that is movable above a guide surface;
   a device table coupled to the stage, the device table retaining the device;
   a mover assembly connected to the device table, the mover assembly moving the device table relative to the stage and generates reaction forces and moves the stage; and
   a damping assembly coupled to the mover assembly, the damping assembly reducing the reaction forces that are transferred to the stage.

2. The stage assembly of claim 1 wherein the damping assembly is coupled to the mover assembly and the stage.

3. The stage assembly of claim 1 wherein the mover assembly moves the device table with at least two degrees of freedom and the damping assembly reduces the reaction forces in the two degrees of freedom that are transferred to the stage.

4. The stage assembly of claim 1 wherein the mover assembly moves the device table with at least three degrees of freedom and the damping assembly reduces the reaction forces in the three degrees of freedom that are transferred to the stage.

5. The stage assembly of claim 1 wherein the mover assembly moves the device table along a Z axis that is orthogonal to the guide surface and the damping assembly reduces the reaction forces along the Z axis that are transferred to the stage.

6. The stage assembly of claim 5 wherein the mover assembly moves the device table along a Z axis at least, about an X axis and about a Y axis and the damping assembly reduces the reaction forces along the Z axis, about the X axis and about the Y axis that are transferred to the stage.

7. The stage assembly of claim 5 wherein the damping assembly includes a Z reaction mass that moves relative to the stage with at least one degree of freedom and wherein the mover assembly is coupled to the Z reaction mass.

8. The stage assembly of claim 7 wherein the Z reaction mass moves relative to the stage with three degrees of freedom.

9. The stage assembly of claim 7 wherein the damping assembly includes a mass guide that allows for motion of the Z reaction mass relative to the stage.

10. The stage assembly of claim 9 wherein the mass guide includes a flexible connector that flexibly secures the Z reaction mass to the stage.

11. The stage assembly of claim 9 wherein the mass guide allows for motion of the Z reaction mass along a Z axis and inhibits motion of the Z reaction mass along an X axis.

12. The stage assembly of claim 7 wherein the damping assembly includes mass trim that adjusts the position of the Z reaction mass relative to the stage.

13. The stage assembly of claim 12 wherein the mass trim includes at least one trim mover that is connected to the Z reaction mass and moves the Z reaction mass relative to the stage.

14. The stage assembly of claim 12 wherein the mass trim includes a fluid bellow that is connected to the Z reaction mass.

15. The stage assembly of claim 5 wherein the mover assembly includes a vertical mover assembly that moves the device table along a Z axis, about an X axis and about a Y axis relative to the stage, the vertical mover assembly including a first component secured to the device table and a second component secured to the damping assembly.

16. The stage assembly of claim 15 wherein the mover assembly includes a horizontal mover assembly that moves the device table along the X axis, along the Y axis and about the Z axis relative to the stage.

17. The stage assembly of claim 1 wherein the mover assembly generates reaction forces when moving the stage; wherein the stage assembly further comprises a stage base that includes the guide surface and supports the stage and wherein the damper assembly reduces the reaction forces generated during movement of the stage by the mover assembly that are transferred to the stage base.

18. The stage assembly of claim 1 wherein the mover assembly moves the device table with at least four degrees of freedom and the damping assembly reduces the reaction forces in the at least four degrees of freedom.

19. The stage assembly of claim 1 wherein the mover assembly moves the device table with six degrees of freedom and the damping assembly reduces the reaction forces in the six degrees of freedom.

20. An exposure apparatus including the stage assembly of claim 1.

21. A process for manufacturing a device including the step of utilizing the exposure apparatus according to claim 20.

22. A process for making a wafer on which an image has been formed including the step of utilizing the exposure apparatus according to claim 20.

23. A stage assembly that moves a device relative to a stage base, the stage assembly comprising:
   a stage;
   a device table that retains the device, the device table being coupled to the stage;
   a mover assembly coupled to the device table, the mover assembly moving the stage and the device table with at least one degree of freedom relative to the stage base and generating reaction forces in at least one degree of freedom, the mover assembly moving the device table with at least one degree of freedom relative to the stage and generating reaction forces in at least one degree of freedom; and
   a damping assembly coupled to the mover assembly, the damping assembly reducing the reaction forces from the mover assembly in at least one degree of freedom that are transferred to the stage base, the damping assembly reducing the reaction forces from the mover assembly in at least one degree of freedom that are transferred to the stage.

24. The stage assembly of claim 23 wherein the mover assembly moves the device table with five degrees of freedom and the damping assembly is adapted to reduce the reaction forces in the five degrees of freedom that are transferred to the stage base.

25. The stage assembly of claim 23 wherein the mover assembly moves the device table with six degrees of freedom and the damping assembly is adapted to reduce the reaction forces in the six degrees of freedom that are transferred to the stage base.

26. The stage assembly of claim 23 wherein the damping assembly reduces the reaction forces that are transferred to the stage base during movement of the stage relative to the stage base.

27. The stage assembly of claim 23 wherein the mover assembly moves the device table along a Z axis, about an X axis and about a Y axis, the Z axis is orthogonal to a guide surface of the stage base and, the X axis and the Y axis being orthogonal to the Z axis and the damping assembly reduces the reaction forces along the Z axis, about the X axis and about the Y axis that are transferred to the stage base.

28. The stage assembly of claim 27 wherein the damping assembly includes a Z reaction mass that moves relative to the stage base with at least one degree of freedom and wherein the mover assembly is coupled to the Z reaction mass.

29. The stage assembly of claim 28 wherein the Z reaction mass moves relative to the stage base with three degrees of freedom.

30. The stage assembly of claim 29 wherein the damping assembly includes a mass guide that allows for motion of the Z reaction mass relative to the stage base.

31. The stage assembly of claim 30 wherein the mass guide includes a flexible connector that flexibly secures the Z reaction mass to the stage.

32. The stage assembly of claim 30 wherein the mass guide allows for motion of the Z reaction mass along a Z axis and inhibits motion of the Z reaction mass along an X axis relative to the stage base.

33. The stage assembly of claim 29 wherein the damping assembly includes a mass trim that adjusts the position of the Z reaction mass relative to the stage base.

34. The stage assembly of claim 33 wherein the mass trim includes at least one trim mover that is connected to the Z reaction mass and moves the Z reaction mass relative to the stage base.

35. The stage assembly of claim 33 wherein the mass trim includes a fluid bellow that is coupled to the Z reaction mass.

36. The stage assembly of claim 27 wherein the mover assembly includes a vertical mover assembly that moves the device table along a Z axis, about an X axis and about a Y axis relative to the stage base, the vertical mover assembly including a first component secured to the device table and a second component secured to the damping assembly.

37. The stage assembly of claim 36 wherein the mover assembly includes a horizontal mover assembly that moves the device table along the X axis, along the Y axis and about the Z axis relative to the stage base.

38. The stage assembly of claim 27 wherein the damping assembly includes a Z reaction mass that moves along a Z axis and a X reaction mass that moves along an X axis.

39. The stage assembly of claim 27 wherein the damping assembly includes a Z reaction mass that moves along a Z axis, a X reaction mass that moves along an X axis and a Y reaction mass that moves along a Y axis.

40. The stage assembly of claim 39 wherein the Z reaction mass also moves at least one of about the X axis and about the Y axis.

41. The stage assembly of claim 39 wherein the mover assembly includes (i) a stage mover assembly that moves the stage relative to the stage base, the stage mover assembly being coupled to the X reaction mass and the Y reaction mass so that movement of the stage by the stage mover assembly results in movement of the X reaction mass and the Y reaction mass, and (ii) a table mover assembly that moves the device table relative to the stage, the table mover assembly being coupled to the Z reaction mass so that movement of the device table by the table mover assembly results in movement of the Z reaction mass.

42. The stage assembly of claim 39 further comprising a reaction mover assembly that adjusts the position of the X reaction mass relative to the stage base along the X axis.

43. The stage assembly of claim 42 wherein the reaction mover assembly adjusts the position of the Y reaction mass relative to the stage base along the Y axis.

44. An exposure apparatus including the stage assembly of claim 23.

45. A process for manufacturing a device including the step of utilizing the exposure apparatus according to claim 44.

46. A process for making a wafer on which an image has been formed including the step of utilizing the exposure apparatus according to claim 44.

47. A stage assembly that moves a device along a Z axis, about an X axis and about a Y axis relative to a stage base, the X axis and the Y axis being substantially orthogonal to the Z axis, the stage assembly comprising:
a stage that is supported by the stage base;
a device table that retains the device;
a mover assembly connected to the device table, the mover assembly moving the device table along the Z axis, about the X axis and about the Y axis and generating reaction forces, the mover assembly moving the device table with at least one degree of freedom relative to the stage and generating reaction forces in at least one degree of freedom; and
a damping assembly coupled to the mover assembly, the damping assembly being adapted to reduce the reaction forces along at least one of the Z axis, about the X axis and about the Y axis that are transferred to the stage base, the damping assembly reducing the reaction forces from the mover assembly in at least one degree of freedom that are transferred to the stage.

48. The stage assembly of claim 47 wherein the mover assembly moves the device table with at least four degrees of freedom relative to the stage base and generates reaction forces in at least four degrees of freedom; and the damping assembly reduces the reaction forces from the mover assembly in at least four degrees of freedom that are transferred to the stage base.

49. The stage assembly of claim 47 wherein the mover assembly moves the device table with six degrees of freedom and the damping assembly is adapted to reduce the reaction forces in the six degrees of freedom that are transferred to the stage base.

50. The stage assembly of claim 47 wherein the mover assembly moves the stage relative to the stage base.

51. The stage assembly of claim 50 wherein the damping assembly reduces the reaction forces that are transferred to the stage base during movement of the stage relative to the stage base.

52. The stage assembly of claim 47 wherein the damping assembly includes a Z reaction mass that moves relative to the stage base with at least one degree of freedom and wherein the mover assembly is coupled to the Z reaction mass.

53. The stage assembly of claim 52 wherein the Z reaction mass moves relative to the stage base with three degrees of freedom.

54. The stage assembly of claim 52 wherein the damping assembly includes a mass guide that allows for motion of the Z reaction mass relative to the stage base.

55. The stage assembly of claim 54 wherein the mass guide includes a flexible connector that flexibly secures the Z reaction mass.

56. The stage assembly of claim 54 wherein the mass guide allows for motion of the Z reaction mass along the Z axis and inhibits motion of the Z reaction mass along the X axis relative to the stage base.

57. The stage assembly of claim 52 wherein the damping assembly includes mass trim that adjusts the position of the Z reaction mass relative to the stage base.

58. The stage assembly of claim 57 wherein the mass trim includes at least one trim mover that is connected to the Z reaction mass and moves the Z reaction mass relative to the stage base.

59. The stage assembly of claim 57 wherein the mass trim includes a fluid bellow that is coupled to the Z reaction mass.

60. The stage assembly of claim 47 wherein the mover assembly includes a vertical mover assembly that moves the device table along the Z axis, about the X axis and about the Y axis relative to the stage base, the vertical mover assembly including a first component coupled to the device table and a second component coupled to the damping assembly.

61. The stage assembly of claim 60 wherein the mover assembly includes a horizontal mover assembly that moves the device table along the X axis, along the Y axis and about the Z axis relative to the stage base.

62. The stage assembly of claim 47 wherein the damping assembly includes a Z reaction mass that moves along the Z axis and a X reaction mass that moves along the X axis.

63. The stage assembly of claim 47 wherein the damping assembly includes a Z reaction mass that moves along the Z axis, a X reaction mass that moves along the X axis and a Y reaction mass that moves along the Y axis.

64. The stage assembly of claim 63 wherein the Z reaction mass also moves at least one of about the X axis and about the Y axis.

65. The stage assembly of claim 63 wherein the mover assembly includes (i) a stage mover assembly that moves the stage relative to the stage base, the stage mover assembly being coupled to the X reaction mass and the Y reaction mass so that movement of the stage by the stage mover assembly results in movement of the X reaction mass and the Y reaction mass, and (ii) a table mover assembly that moves the device table relative to the stage, the table mover assembly being coupled to the Z reaction mass so that movement of the device table by the table mover assembly results in movement of the Z reaction mass.

66. The stage assembly of claim 63 further comprising a reaction mover assembly that adjusts the position of the X reaction mass relative to the stage base along the X axis.

67. The stage assembly of claim 66 wherein the reaction mover assembly adjusts the position of the Y reaction mass relative to the stage base along the Y axis.

68. An exposure apparatus including the stage assembly of claim 47.

69. A process for manufacturing a device including the step of utilizing the exposure apparatus according to claim 68.

70. A process for making a wafer on which an image has been formed including the step of utilizing the exposure apparatus according to claim 68.

71. A method for making a stage assembly that moves a device, the method comprising the steps of:
providing a stage, the stage being movable above a guide surface;
connecting a stage mover assembly to the stage;
providing a device table that retains the device;
connecting a table mover assembly to the device table, the table mover assembly generating reaction forces; and
connecting a damping assembly to the table mover assembly, the damping assembly reducing the reaction forces that are transferred to the stage.

72. The method of claim 71 wherein the mover assembly moves the device table along a Z axis that is orthogonal to the guide surface and the damping assembly reduces the reaction forces along the Z axis that are transferred to the stage.

73. The method of claim 72 wherein the table mover assembly moves the device table with at least two degrees of freedom and the damping assembly reduces the reaction forces with at least two degrees of freedom that are transferred to the stage.

74. The method of claim 72 wherein the table mover assembly moves the device table with at least three degrees of freedom and the damping assembly reduces the reaction forces with at least three degrees of freedom that are transferred to the stage.

75. The method of claim 74 wherein the table mover assembly moves the device table along a Z axis, about an X axis and about a Y axis and the damping assembly reduces the reaction forces along a Z axis, about an X axis and about a Y axis that are transferred to the stage.

76. The method of claim 72 wherein the damping assembly includes a Z reaction mass that moves relative to the stage with at least one degree of freedom and wherein the table mover assembly is coupled to the Z reaction mass.

77. The method of claim 76 wherein the step of providing a Z reaction mass includes the step of connecting the Z reaction mass to the stage so that the Z reaction mass is free to move relative to the stage with three degrees of freedom.

78. The method of claim 76 wherein the Z reaction mass moves relative to the stage with three degrees of freedom.

79. A method for making an exposure apparatus that forms an image on a substrate, the method comprising the steps of:
providing an irradiation apparatus that irradiates the substrate with radiation to form the image on the substrate; and
providing the stage assembly made by the method of claim 71.

80. A method of making a wafer utilizing the exposure apparatus made by the method of claim 79.

81. A method for making a stage assembly that moves a device relative to a stage base, the method comprising the steps of:
providing a stage that is supported by the stage base;
providing a device table that retains the device;
connecting a mover assembly to the device table, the mover assembly moving the device table with at least four degrees of freedom relative to the stage base and generating reaction forces in the four degrees of freedom; and
connecting a damping assembly to the mover assembly, at least a portion of the damping assembly being located substantially directly between the stage and the device table, the damping assembly reducing the reaction forces from the mover assembly in at least four degrees of freedom that are transferred to the stage base.

82. The method of claim 81 wherein the mover assembly moves the device table along a Z axis that is orthogonal to a guide surface of the stage base, about an X axis and about a Y axis, and the damping assembly reduces the reaction forces along the Z axis, about the X axis and about the Y axis that are transferred to the stage base.

83. The method of claim 81 wherein the mover assembly moves the device table with at least five degrees of freedom and the damping assembly reduces the reaction forces with at least five degrees of freedom that are transferred to the stage base.

84. The method of claim 81 wherein the mover assembly moves the device table with at least six degrees of freedom and the damping assembly reduces the reaction forces with at least six degrees of freedom that are transferred to the stage base.

85. The method of claim 81 wherein the step of connecting the damping assembly includes the step of connecting a Z reaction mass to the mover assembly, the Z reaction mass moving relative to the stage base with at least one degree of freedom.

86. The method of claim 85 wherein the step of connecting a Z reaction mass includes the step of coupling the Z reaction mass to the stage so that the Z reaction mass is free to move relative to the stage with three degrees of freedom.

87. A method for making an exposure apparatus that forms an image on a substrate, the method comprising the steps of:

providing an irradiation apparatus that irradiates the substrate with radiation to form the image on the substrate; and providing the stage assembly made by the method of claim 81.

88. A method of making a wafer utilizing the exposure apparatus made by the method of claim 87.

89. A method for making a stage assembly that moves a device along a Z axis, about an X axis and about a Y axis relative to a stage base, the X axis and the Y axis being substantially orthogonal to the Z axis, the method comprising the steps of:

providing a stage that is supported by the stage base;

providing a device table that retains the device;

connecting a mover assembly to the device table, the mover assembly moving the device table along the Z axis, about the X axis and about the Y axis and generating forces along the Z axis, about the X axis and about the Y axis; and connecting a damping assembly to the mover assembly, at least a portion of the damping assembly being located substantially directly between the stage and the device table, the damping assembly reducing the reaction forces along the Z axis, about the X axis and about the Y axis that are transferred to the stage base.

90. The method of claim 89 wherein the mover assembly moves the device table along the X axis and of the damping assembly reduces the reaction forces along the X axis that are transferred to the stage base.

91. The method of claim 90 wherein the mover assembly moves the device table along the Y axis and the damping assembly reduces the reaction forces along the Y axis that are transferred to the stage base.

92. The method of claim 91 wherein the mover assembly moves the device table about the Z axis and the damping assembly reduces the reaction forces about the Z axis that are transferred to the stage base.

93. The method of claim 92 wherein the step of connecting the damping assembly includes the step of connecting a Z reaction mass, and X reaction mass, and a Y reaction mass to the mover assembly respectively, and wherein the Z reaction mass moves along the Z axis;

the X reaction mass moves along the X axis; and the Y reaction mass moves along the Y axis.

94. A method for making an exposure apparatus that forms an image on a substrate, the method comprising the steps of:

providing an irradiation apparatus that irradiates the substrate with radiation to form the image on the substrate; and providing the stage assembly made by the method of claim 89.

95. A method of making a wafer utilizing the exposure apparatus made by the method of claim 94.

96. A method for making an object including at least the photolithography process, wherein the photolithography process utilizes the exposure apparatus made by the method of claim 79.

97. A method for making an object including at least the photolithography process, wherein the photolithography process utilizes the exposure apparatus made by the method of claim 87.

98. A method for making an object including at least the photolithography process, wherein the photolithography process utilizes the exposure apparatus made by the method of claim 94.

99. A stage assembly that moves a device relative to a stage base, the stage assembly comprising:

a device table that retains the device;

a mover assembly coupled to the device table, the mover assembly moving the device table with at least four degrees of freedom relative to the stage base and generating reaction forces in at least four degrees of freedom, the mover assembly including a vertical assembly mover that moves the device table along a Z axis, about an X axis and about a Y axis relative to the stage base, the Z axis being orthogonal to a guide surface of the stage base, and the X axis and the Y axis being orthogonal to the Z axis; and a damping assembly coupled to the mover assembly, the damping assembly reducing the reaction forces from the mover assembly in at least four degrees of freedom that are transferred to the stage base, the damping assembly reducing the reaction forces along the Z axis, about the X axis and about the Y axis that are transferred to the stage base, the vertical mover assembly including a first component secured to the device table and a second component secured to the damping assembly.

100. The stage assembly of claim 99 wherein the mover assembly includes a horizontal mover assembly that moves the device table along the X axis, along the Y axis and about the Z axis relative to the stage base.

101. The stage assembly of claim 99 wherein the mover assembly moves the device table with five degrees of freedom and the damping assembly is adapted to reduce the reaction forces in the five degrees of freedom that are transferred to the stage base.

102. The stage assembly of claim 99 wherein the mover assembly moves the device table with six degrees of freedom and the damping assembly is adapted to reduce the reaction forces in the six degrees of freedom that are transferred to the stage base.

103. The stage assembly of claim 99 further comprising a stage, wherein the mover assembly moves the stage relative to the stage base and the mover assembly moves the device table relative to the stage and wherein the damping assembly is coupled to the stage and reduces the reaction forces that are transferred to the stage.

104. The stage assembly of claim 103 wherein the damping assembly reduces the reaction forces that are transferred to the stage base during movement of the stage relative to the stage base.

105. The stage assembly of claim 99 wherein the damping assembly includes a Z reaction mass that moves relative to the stage base with at least one degree of freedom and wherein the mover assembly is coupled to the Z reaction mass.

106. The stage assembly of claim 105 wherein the Z reaction mass moves relative to the stage base with three degrees of freedom.

107. The stage assembly of claim 105 wherein the damping assembly includes a mass guide that allows for motion of the Z reaction mass relative to the stage base.

108. The stage assembly of claim 107 wherein the mass guide includes a flexible connector that flexibly secures the Z reaction mass to a stage.

109. The stage assembly of claim 107 wherein the mass guide allows for motion of the Z reaction mass along the Z axis and inhibits motion of the Z reaction mass along the X axis relative to the stage base.

110. The stage assembly of claim 105 wherein the damping assembly includes a mass trim that adjusts the position of the Z reaction mass relative to the stage base.

111. The stage assembly of claim 110 wherein the mass trim includes at least one trim motor that is connected to the Z reaction mass and moves the Z reaction mass relative to the stage base.

112. The stage assembly of claim 110 wherein the mass trim includes a fluid bellow that is coupled to the Z reaction mass.

113. An exposure apparatus including the stage assembly of claim 99.

114. A process for manufacturing a device including the step of utilizing the exposure apparatus according to claim 113.

115. A process for making a wafer on which an image has been formed including the step of utilizing the exposure apparatus according to claim 113.

116. A stage assembly that moves a device relative to a stage base, the stage assembly comprising:
a device table that retains the device;
a mover assembly coupled to the device table, the mover assembly moving the device table with at least four degrees of freedom relative to the stage base and generating reaction forces in at least four degrees of freedom, the mover assembly moving the device table along a Z axis, about an X axis and about a Y axis relative to the stage base, the Z axis being orthogonal to a guide surface of the stage base, and the X axis and the Y axis being orthogonal to the Z axis; and
a damping assembly coupled to the mover assembly, the damping assembly reducing the reaction forces from the mover assembly in at least four degrees of freedom that are transferred to the stage base, the damping assembly reducing the reaction forces along the Z axis, about the X axis and about the Y axis that are transferred to the stage base, the damping assembly including a Z reaction mass that moves along the Z axis and an X reaction mass that moves along the X axis.

117. The stage assembly of claim 116 wherein the damping assembly further includes a Y reaction mass that moves along the Y axis.

118. The stage assembly of claim 117 wherein the Z reaction mass also moves at least one of about the X axis and about the Y axis.

119. The stage assembly of claim 117 wherein the mover assembly includes (i) a stage mover assembly that moves a stage relative to the stage base, the stage mover assembly being coupled to the X reaction mass and the Y reaction mass so that movement of the stage by the stage mover assembly results in movement of the X reaction mass and the Y reaction mass, and (ii) a table mover assembly that moves the device table relative to the stage, the table mover assembly being coupled to the Z reaction mass so that movement of the device table by the table mover assembly results in movement of the Z reaction mass.

120. The stage assembly of claim 117 further comprising a reaction mover assembly that adjusts the position of the X reaction mass relative to the stage base along the X axis.

121. The stage assembly of claim 120 wherein the reaction mover assembly adjusts the position of the Y reaction mass relative to the stage base along the Y axis.

122. The stage assembly of claim 116 wherein the mover assembly moves the device table with five degrees of freedom and the damping assembly is adapted to reduce the reaction forces in the five degrees of freedom that are transferred to the stage base.

123. The stage assembly of claim 116 wherein the mover assembly moves the device table with six degrees of freedom and the damping assembly is adapted to reduce the reaction forces in the six degrees of freedom that are transferred to the stage base.

124. The stage assembly of claim 116 further comprising a stage, wherein the mover assembly moves the stage relative to the stage base and the mover assembly moves the device table relative to the stage and wherein the damping assembly is coupled to the stage and reduces the reaction forces that are transferred to the stage.

125. The stage assembly of claim 124 wherein the damping assembly reduces the reaction forces that are transferred to the stage base during movement of the stage relative to the stage base.

126. The stage assembly of claim 116 wherein the mover assembly is secured to the Z reaction mass.

127. The stage assembly of claim 117 wherein the Z reaction mass moves relative to the stage base with three degrees of freedom.

128. The stage assembly of claim 118 wherein the damping assembly includes a mass guide that allows for motion of the Z reaction mass relative to the stage base.

129. The stage assembly of claim 128 wherein the mass guide includes a flexible connector that flexibly secures the Z reaction mass to a stage.

130. The stage assembly of claim 128 wherein the mass guide allows for motion of the Z reaction mass along the Z axis and inhibits motion of the Z reaction mass along the X axis relative to the stage base.

131. The stage assembly of claim 116 wherein the damping assembly includes a mass trim that adjusts the position of the Z reaction mass relative to the stage base.

132. The stage assembly of claim 131 wherein the mass trim includes at least one trim motor that is connected to the Z reaction mass and moves the Z reaction mass relative to the stage base.

133. The stage assembly of claim 131 wherein the mass trim includes a fluid bellow that is coupled to the Z reaction mass.

134. The stage assembly of claim 116 wherein the mover assembly includes a vertical mover assembly that moves the device table along the Z axis, about the X axis and about the Y axis relative to the stage base, the vertical mover assembly including a first component secured to the device table and a second component secured to the damping assembly.

135. The stage assembly of claim 134 wherein the mover assembly includes a horizontal mover assembly that moves the device table along the X axis, along the Y axis and about the Z axis relative to the stage base, the horizontal mover assembly being secured to the X reaction mass.

136. An exposure apparatus including the stage assembly of claim 116.

137. A process for manufacturing a device including the step of utilizing the exposure apparatus according to claim 136.

138. A process for making a wafer on which an image has been formed including the step of utilizing the exposure apparatus according to claim 136.

139. A stage assembly that moves a device along a Z axis, about an X axis and about a Y axis relative to a stage base, the X axis and the Y axis being substantially orthogonal to the Z axis, the stage assembly comprising:
a device table that retains the device;
a mover assembly connected to the device table, the mover assembly moving the device table along the Z axis, about the X axis and about the Y axis and generating reaction forces; and
a damping assembly coupled to the mover assembly, the damping assembly being adapted to reduce the reaction forces along the Z axis, about the X axis and about the Y axis that are transferred to the stage base, the damping assembly including a Z reaction mass that moves along the Z axis and an X reaction mass that moves along the X axis.

140. The stage assembly of claim 139 wherein the damping assembly further includes a Y reaction mass that moves along the Y axis.

141. The stage assembly of claim 140 wherein the Z reaction mass also moves at least one of about the X axis and about the Y axis.

142. The stage assembly of claim 140 wherein the mover assembly includes (i) a stage mover assembly that moves a stage relative to the stage base, the stage mover assembly being coupled to the X reaction mass and the Y reaction mass so that movement of the stage by the stage mover assembly results in movement of the X reaction mass and the Y reaction mass, and (ii) a table mover assembly that moves the device table relative to the stage, the table mover assembly being coupled to the Z reaction mass so that movement of the device table by the table mover assembly results in movement of the Z reaction mass.

143. The stage assembly of claim 140 further comprising a reaction mover assembly that adjusts the position of the X reaction mass relative to the stage base along the X axis.

144. The stage assembly of claim 143 wherein the reaction mover assembly adjusts the position of the Y reaction mass relative to the stage base along the Y axis.

145. The stage assembly of claim 139 wherein the mover assembly moves the device table with at least four degrees of freedom relative to the stage base and generates reaction forces in at least four degrees of freedom, and the damping assembly reduces the reaction forces from the mover assembly in at least four degrees of freedom that are transferred to the stage base.

146. The stage assembly of claim 139 wherein the mover assembly moves the device table with six degrees of freedom and the damping assembly is adapted to reduce the reaction forces in the six degrees of freedom that are transferred to the stage base.

147. The stage assembly of claim 139 further comprising a stage, wherein the mover assembly moves the stage relative to the stage base and the mover assembly moves the device table relative to the stage and wherein the damping assembly is coupled to the stage and reduces the reaction forces that are transferred to the stage.

148. The stage assembly of claim 147 wherein the damping assembly reduces the reaction forces that are transferred to the stage base during movement of the stage relative to the stage base.

149. The stage assembly of claim 139 wherein the mover assembly is secured to the Z reaction mass.

150. The stage assembly of claim 139 wherein the Z reaction mass moves relative to the stage base with three degrees of freedom.

151. The stage assembly of claim 139 wherein the damping assembly includes a mass guide that allows for motion of the Z reaction mass relative to the stage base.

152. The stage assembly of claim 151 wherein the mass guide includes a flexible connector that flexibly secures the Z reaction mass to a stage.

153. The stage assembly of claim 151 wherein the mass guide allows for motion of the Z reaction mass along the Z axis and inhibits motion of the Z reaction mass along the X axis relative to the stage base.

154. The stage assembly of claim 139 wherein the damping assembly includes a mass trim that adjusts the position of the Z reaction mass relative to the stage base.

155. The stage assembly of claim 154 wherein the mass trim includes at least one trim motor that is connected to the Z reaction mass and moves the Z reaction mass relative to the stage base.

156. The stage assembly of claim 154 wherein the mass trim includes a fluid bellow that is coupled to the Z reaction mass.

157. The stage assembly of claim 139 wherein the mover assembly includes a vertical mover assembly that moves the device table along the Z axis, about the X axis and about the Y axis relative to the stage base, the vertical mover assembly including a first component secured to the device table and a second component secured to the damping assembly.

158. The stage assembly of claim 157 wherein the mover assembly includes a horizontal mover assembly that moves the device table along the X axis, along the Y axis and about the Z axis relative to the stage base, the horizontal mover assembly being secured to the X reaction mass.

159. An exposure apparatus including the stage assembly of claim 139.

160. A process for manufacturing a device including the step of utilizing the exposure apparatus according to claim 159.

161. A process for making a wafer on which an image has been formed including the step of utilizing the exposure apparatus according to claim 159.

162. A method for making a stage assembly that moves a device along a Z axis, about an X axis and about a Y axis relative to a stage base, the X axis and the Y axis being substantially orthogonal to the Z axis, the method comprising the steps of:
providing a device table that retains the device;
connecting a mover assembly to the device table, the mover assembly moving the device table along the Z axis, along the X axis, along the Y axis, about the Z axis, about the X axis and about the Y axis and generating forces along the Z axis, along the X axis, along the Y axis, about the Z axis, about the X axis and about the Y axis; and
connecting a damping assembly to the mover assembly, the damping assembly including a Z reaction mass that moves along the Z axis, an X reaction mass that moves along the X axis and a Y reaction mass that moves along the Y axis, the damping assembly reducing the reaction forces along the Z axis, along the X axis, along the Y axis, about the Z axis, about the X axis and about the Y axis that are transferred to the stage base.

163. A method for making an exposure apparatus that forms an image on a substrate, the method comprising the steps of:
providing an irradiation apparatus that irradiates the substrate with radiation to form an image on the substrate; and
providing the stage assembly made by the method of claim 162.

164. A method of making a wafer utilizing the exposure apparatus made by the method of claim 163.

165. A method for making an object including at least the photolithography process, wherein the photolithography process utilizes the exposure apparatus made by the method of claim 163.

166. A stage assembly that moves a device along a Z axis, about an X axis and about a Y axis relative to a stage base, the X axis and the Y axis being substantially orthogonal to the Z axis, the stage assembly comprising:
  a device table that retains the device;
  a mover assembly connected to the device table, the mover assembly including a vertical mover assembly that moves the device table along the Z axis, about the X axis and about the Y axis relative to the stage base and generates reaction forces; and
  a damping assembly coupled to the mover assembly, the damping assembly being adapted to reduce the reaction forces along the Z axis, about the X axis and about the Y axis that are transferred to the stage base, the vertical mover assembly including a first component coupled to the device table and a second component coupled to the damping assembly.

167. The stage assembly of claim 166 wherein the mover assembly includes a horizontal mover assembly that moves the device table along the X axis, along the Y axis and about the Z axis.

168. The stage assembly of claim 166 wherein the mover assembly moves the device table with at least four degrees of freedom relative to the stage base and generates reaction forces in at least four degrees of freedom, and the damping assembly reduces the reaction forces from the mover assembly in at least four degrees of freedom that are transferred to the stage base.

169. The stage assembly of claim 166 wherein the mover assembly moves the device table with six degrees of freedom and the damping assembly is adapted to reduce the reaction forces in the six degrees of freedom that are transferred to the stage base.

170. The stage assembly of claim 166 further comprising a stage, wherein the mover assembly moves the stage relative to the stage base and the mover assembly moves the device table relative to the stage and wherein the damping assembly is coupled to the stage and reduces the reaction forces that are transferred to the stage.

171. The stage assembly of claim 170 wherein the damping assembly reduces the reaction forces that are transferred to the stage base during movement of the stage relative to the stage base.

172. The stage assembly of claim 166 wherein the damping assembly includes a Z reaction mass that moves relative to the stage base with at least one degree of freedom and wherein the mover assembly is secured to the Z reaction mass.

173. The stage assembly of claim 172 wherein the Z reaction mass moves relative to the stage base with three degrees of freedom.

174. The stage assembly of claim 172 wherein the damping assembly includes a mass guide that allows for motion of the Z reaction mass relative to the stage base.

175. The stage assembly of claim 174 wherein the mass guide includes a flexible connector that flexibly secures the Z reaction mass to a stage.

176. The stage assembly of claim 174 wherein the mass guide allows for motion of the Z reaction mass along the Z axis and inhibits motion of the Z reaction mass along the X axis relative to the stage base.

177. The stage assembly of claim 172 wherein the damping assembly includes a mass trim that adjusts the position of the Z reaction mass relative to the stage base.

178. The stage assembly of claim 177 wherein the mass trim includes at least one trim motor that is connected to the Z reaction mass and moves the Z reaction mass relative to the stage base.

179. The stage assembly of claim 177 wherein the mass trim includes a fluid bellow that is coupled to the Z reaction mass.

180. An exposure apparatus including the stage assembly of claim 166.

181. A process for manufacturing a device including the step of utilizing the exposure apparatus according to claim 180.

182. A process for making a wafer on which an image has been formed including the step of utilizing the exposure apparatus according to claim 180.

183. A stage assembly that moves a device relative to a stage base that includes a guide surface, the stage assembly comprising:
  a device table retaining the device;
  a mover assembly connected to the device table, the mover assembly moving the device table along a first axis and along a second axis relative to the stage base and generating reaction forces along the first axis and along the second axis, the second axis being orthogonal to the first axis and the guide surface; and
  a damping assembly coupled to the mover assembly, the damping assembly reducing the reaction forces transferred to the stage base, the damping assembly including a X reaction mass and a Z reaction mass, the X reaction mass moving along the first axis and being inhibited from moving along second axis relative to the stage base.

184. The stage assembly of claim 183 further comprising a stage and wherein the mover assembly moves the device table along the second axis relative to the stage, wherein the mover assembly moves the stage relative to the stage base, wherein the Z reaction mass reduces the reaction forces along the second axis that are transferred to the stage.

185. The stage assembly of claim 183 further comprising a stage that is moved by the mover assembly, the mover assembly also moving the device table with at least two degrees of freedom relative to the stage and generating reaction forces in at least two degrees of freedom, wherein the Z reaction mass reduces the reaction forces from the mover assembly in at least two degrees of freedom that are transferred to the stage.

186. The stage assembly of claim 183 further comprising a stage that is moved by the mover assembly, the mover assembly also moving the device table with at least three degrees of freedom relative to the stage and generating reaction forces in at least three degrees of freedom, wherein the Z reaction mass reduces the reaction forces from the mover assembly in at least three degrees of freedom that are transferred to the stage.

187. The stage assembly of claim 183 wherein the mover assembly is secured to the Z reaction mass.

188. The stage assembly of claim 183 further comprising a mass trim motor that corrects the position of the Z reaction mass along the second axis.

189. The stage assembly of claim 183 wherein the damping assembly includes a mass guide that allows for the motion of the Z reaction mass along the second axis and inhibits motion of the Z reaction mass along the first axis.

190. An exposure apparatus including the stage assembly of claim 183.

191. A process for manufacturing a device including the step of utilizing the exposure apparatus according to claim 190.

192. A process for making a wafer on which an image has been formed including the step of utilizing the exposure apparatus according to claim 190.

193. A stage assembly that moves a device along a first axis, along a second axis, and along a third axis relative to a stage base, the stage assembly comprising:

- a stage;
- a device table that retains the device;
- a mover assembly that moves the stage relative to the stage base along the first axis and the second axis and the device table relative to the stage along the third axis and generating reaction forces along the third axis; and
- a damping assembly coupled to the mover assembly, the damping assembly reducing the reaction forces along the third axis that are transferred to the stage base, the damping assembly including a Z reaction mass and a mass trim motor that adjusts the position of the Z reaction mass relative to the stage base.

194. The stage assembly of claim 193 wherein the mass trim motor corrects the position of the Z reaction mass along the third axis, about the first axis and about the second axis.

195. The stage assembly of claim 193 wherein the damping assembly includes a mass guide that allows for the motion of the Z reaction mass along the third axis and inhibits motion of the Z reaction mass along the first axis and along the second axis.

196. The stage assembly of claim 193 wherein the damping assembly includes a fluid bellow that is connected to the Z reaction mass.

197. The stage assembly of claim 193 wherein the damping assembly further includes a X reaction mass that reduces reaction forces along the first axis that are transferred to the stage base from the mover assembly.

198. The stage assembly of claim 193 wherein the mass trim motor adjusts the position of the Z reaction mass relative to the stage.

199. An exposure apparatus including the stage assembly of claim 198.

200. A process for manufacturing a device including the step of utilizing the exposure apparatus according to claim 199.

201. A process for making a wafer on which an image has been formed including the step of utilizing the exposure apparatus according to claim 199.

* * * * *

UNITED STATES PATENT AND TRADEMARK OFFICE
CERTIFICATE OF CORRECTION

PATENT NO. : 6,724,466 B2 Page 1 of 1
DATED : April 20, 2004
INVENTOR(S) : Ono et al.

It is certified that error appears in the above-identified patent and that said Letters Patent is hereby corrected as shown below:

Column 30,
Line 29, please replace "claim 117" with -- claim 116 --.
Line 32, please replace "claim 118" with -- claim 116 --.

Signed and Sealed this

Thirtieth Day of November, 2004

JON W. DUDAS
*Director of the United States Patent and Trademark Office*